(12) United States Patent
Tan et al.

(10) Patent No.: US 9,865,649 B2
(45) Date of Patent: Jan. 9, 2018

(54) INTEGRATED TWO-TERMINAL DEVICE AND LOGIC DEVICE WITH COMPACT INTERCONNECTS HAVING SHALLOW VIA FOR EMBEDDED APPLICATION

(71) Applicant: GLOBALFOUNDRIES Singapore Pte. Ltd., Singapore (SG)

(72) Inventors: Juan Boon Tan, Singapore (SG); Wanbing Yi, Singapore (SG); Yi Jiang, Singapore (SG); Curtis Chun-I Hsieh, Singapore (SG); Danny Pak-Chum Shum, Singapore (SG)

(73) Assignee: GLOBALFOUNDRIES Singapore Pte. Ltd., Singapore (SG)

(*) Notice: Subject to any disclaimer, the term of this patent is extended or adjusted under 35 U.S.C. 154(b) by 0 days.

(21) Appl. No.: 15/247,866

(22) Filed: Aug. 25, 2016

(65) Prior Publication Data
US 2017/0092693 A1    Mar. 30, 2017

Related U.S. Application Data

(60) Provisional application No. 62/232,472, filed on Sep. 25, 2015.

(51) Int. Cl.
| | |
|---|---|
| *H01L 27/22* | (2006.01) |
| *H01L 43/12* | (2006.01) |
| *H01L 43/02* | (2006.01) |
| *H01L 43/08* | (2006.01) |
| *H01L 23/528* | (2006.01) |
| *H01L 23/522* | (2006.01) |

(52) U.S. Cl.
CPC .......... *H01L 27/228* (2013.01); *H01L 23/528* (2013.01); *H01L 23/5226* (2013.01); *H01L 43/02* (2013.01); *H01L 43/08* (2013.01); *H01L 43/12* (2013.01)

(58) Field of Classification Search
CPC . H01L 27/228; H01L 23/5226; H01L 23/528; H01L 43/02; H01L 43/08; H01L 43/12
USPC ........................................... 257/427, 4, 295
See application file for complete search history.

(56) References Cited

U.S. PATENT DOCUMENTS

| | | | |
|---|---|---|---|
| 2010/0193850 A1* | 8/2010 | Asao | H01L 27/228 257/295 |
| 2011/0084314 A1* | 4/2011 | Or-Bach | G03F 9/7076 257/209 |
| 2012/0007214 A1* | 1/2012 | Chu | H01L 23/5223 257/532 |

(Continued)

*Primary Examiner* — Tu-Tu Ho
(74) *Attorney, Agent, or Firm* — Horizon IP PTE Ltd.

(57) ABSTRACT

Devices and methods of forming a device are disclosed. The method includes providing a substrate defined with at least first and second regions and providing a plurality of inter-level dielectric (ILD) levels having tight pitch over the first and second regions of the substrate. An ILD level of which a two-terminal element disposed thereon corresponds to a first ILD level and its metal level corresponds to Mx, an immediate ILD level overlying the metal level Mx corresponds to a second ILD level includes via level Vx and metal level Mx+1 and the next overlying ILD level corresponds to a third ILD level includes via level Vx+1 and metal level Mx+2. The method includes forming a two-terminal device element is formed in between metal level Mx and via level Vx+1 in the first region.

19 Claims, 17 Drawing Sheets

(56) References Cited

U.S. PATENT DOCUMENTS

2014/0264679 A1* 9/2014 Lee .................... H01L 43/12
257/427

* cited by examiner

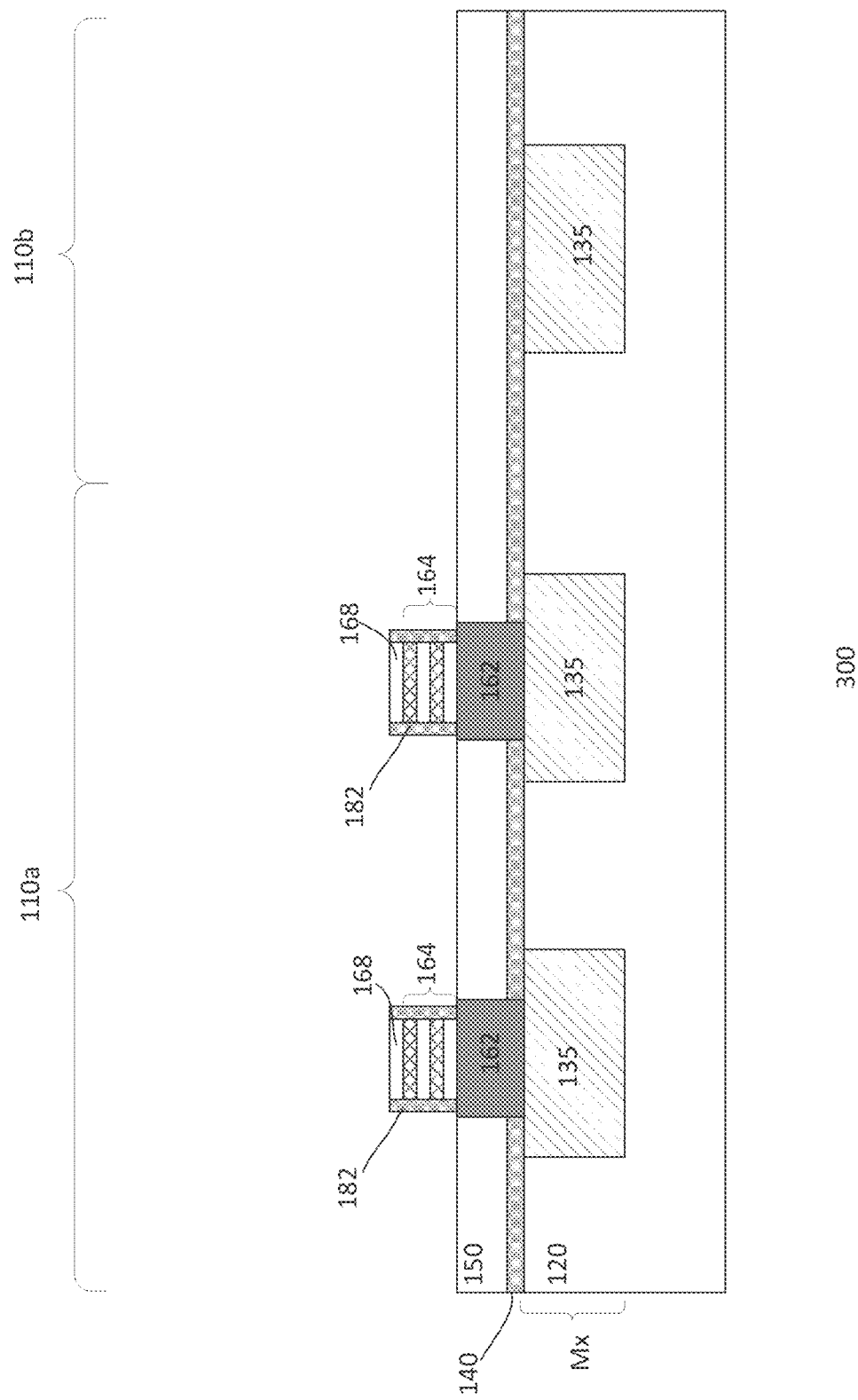

INTEGRATED TWO-TERMINAL DEVICE AND LOGIC DEVICE WITH COMPACT INTERCONNECTS HAVING SHALLOW VIA FOR EMBEDDED APPLICATION

CROSS-REFERENCE TO RELATED APPLICATION

This application claims the priority benefit of U.S. Provisional Application Ser. No. 62/232,472, filed on Sep. 25, 2015, which is hereby incorporated by reference in its entirety for all purposes.

BACKGROUND

As technology evolves into era of sub-micron, there is a desire to integrate various two-terminal device elements such as but not limited to memory elements with high speed logic circuit elements into a single chip or an integrated circuit (IC) to form an embedded memory. An example of the two-terminal device element is a magnetic random access memory (MRAM) element which gains popularity in recent years. MRAM, for example, includes magnetic tunnel junction (MTJ) stack layers sandwiched between top and bottom electrodes or terminals. The MTJ stack layers are generally connected to interconnects in the interlevel dielectric (ILD) layer. To achieve a desired cell size, there is a desire to embed MTJ element in between adjacent metal levels with tight pitch, such as defined at 1× design rule. It is also desirable to embed MTJ element in 1× layers since 1× layers include common components for all offered back-end-of-line (BEOL) stacks, which include contacts. This is not the case for the other metal levels with relaxed pitch, such as 2×, 4× or 6X×. For example, relaxed pitch metal levels do not cover all offered BEOL stacks. Typically, relaxed pitch metal levels only cover one or a few of the available BEOL stack options.

However, it is difficult to integrate the two-terminal device element with logic circuit element in layers having tight pitch (e.g., defined at 1× design rule) since each of these elements has different requirements. For example, the total height of the MTJ stack and top/bottom electrode may not be compatible with the height of the via contact of the logic circuit which is generally shallower than the MTJ element for metal layers with tight pitch. Thus, during integration, the reliabilities of the two-terminal elements such as memory elements may degrade due to the process limitation and tight pitch between layers which cause electrical shorts between metal line and conductive layers of the two-terminal elements.

Accordingly, it is desirable that the process of manufacturing two-terminal device element to be highly compatible with shallow via interconnects in logic processing and it is also desirable to integrate the two-terminal device elements with logic devices into a single chip or an IC in a reliable, simplified and cost effective way.

SUMMARY

Embodiments of the present disclosure generally relate to semiconductor devices and methods for forming a semiconductor device. In one aspect, a method for forming a device is disclosed. The method includes providing a substrate defined with at least first and second regions and providing a plurality of interlevel dielectric (ILD) levels having tight pitch over the first and second regions of the substrate. An ILD level of which a two-terminal element disposed thereon corresponds to a first ILD level and its metal level corresponds to Mx, an immediate ILD level overlying the metal level Mx corresponds to a second ILD level includes via level Vx and metal level Mx+1 and the next overlying ILD level corresponds to a third ILD level includes via level Vx+1 and metal level Mx+2. The method includes forming a two-terminal device element is formed in between metal level Mx and via level Vx+1 in the first region. The two-terminal device element includes a device layer coupled in between first and second terminals. The first terminal is in direct contact with a metal line in metal level Mx of the first region and the second terminal is formed on a top surface of the device layer. A dual damascene interconnect is formed over the second region in the second ILD level. The dual damascene interconnect includes a metal line in metal level Mx+1 and via contact in via level Vx in the second region. The method further includes forming dual damascene interconnects in the third ILD level over the first and second regions. A dual damascene interconnect in the third ILD level includes a metal line in metal level Mx+2 and a via contact in via level Vx+1, and the dual damascene interconnect in the first region is coupled to the two-terminal device element while the dual damascene interconnect in the second region is formed over and is coupled to the dual damascene interconnect in the second ILD level.

In another aspect, a device is presented. The device includes a substrate defined with at least first and second regions and a plurality of interlevel dielectric (ILD) levels having tight pitch disposed over the first and second regions of the substrate. An ILD level of which a two-terminal element is disposed thereon corresponds to a first ILD level and its metal level corresponds to Mx, an immediate ILD level overlying the metal level Mx corresponds to a second ILD level includes via level Vx and metal level Mx+1 and the next overlying ILD level corresponds to a third ILD level includes via level Vx+1 and metal level Mx+2. A two-terminal device element is disposed in between metal level Mx and via level Vx+1 in the first region. The two-terminal device element includes a device layer coupled in between first and second terminals. The first terminal is in direct contact with a metal line in metal level Mx of the first region and the second terminal is disposed on a top surface of the device layer. A dual damascene interconnect is disposed over the second region in the second ILD level. The dual damascene interconnect in the second ILD level includes a metal line in metal level Mx+1 and via contact in via level Vx in the second region. Dual damascene interconnects are disposed in the third ILD level over the first and second regions. A dual damascene interconnect in the third ILD level includes a metal line in metal level Mx+2 and a via contact in via level Vx+1, and the dual damascene interconnect in the first region is coupled to the two-terminal device element and the dual damascene interconnect in the second region is disposed over and is coupled to the dual damascene interconnect in the second ILD level.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the disclosure. In the following description, various embodiments of the present disclosure are described with reference to the following drawings, in which:

FIGS. 3a-3g show cross-sectional views of an embodiment of a process for forming a device.

DETAILED DESCRIPTION

Embodiments of the present disclosure generally relate to cost effective and reliable integration of two-terminal device element with logic device having shallow via interconnects in an integrated circuit (IC). The two-terminal device element includes first and second terminals and a device layer in between and coupled to the first and second terminals. By way of an example as well as for illustration purpose, the two-terminal device element as presented in this disclosure includes a memory or storage element of a spin transfer torque magnetic random access memory (STT-MRAM) device. The memory device includes storage element of a memory cell having MTJ stack layers sandwiched between top and bottom electrodes. In such case, the MTJ stack layers may correspond to the device layer while the top and bottom electrodes may correspond to the top and bottom terminals of the two-terminal device element which provide conducting path for the device element. Depending on the memory type, the electrodes may have additional requirements. For example, the bottom electrode surface roughness needs to be good for MRAM. Embodiments of the present disclosure as will be described later allows reliable insertion of the MTJ stack layers and top/bottom electrode in between layers having tight pitch (e.g., 1× design rule) with via height of the logic component shallower than the total height of the MTJ stack layers and top/bottom electrode. It is understood that embodiments of the present disclosure are also applicable to other suitable types of memory element such as resistive random access memory (RRAM) or other suitable types of two-terminal device elements. Such memory device together with logic components are generally based on any suitable technology node (including but not limited to 28 nm technology node). The memory device together with the logic components can be incorporated into standalone memory devices including, but not limited to, Universal Serial Bus (USB) or other types of portable storage units, or ICs, such as microcontrollers or system on chips (SoCs). The devices or ICs may be incorporated into or used with, for example, consumer electronic products, or relate to other types of devices.

Figure 1A:
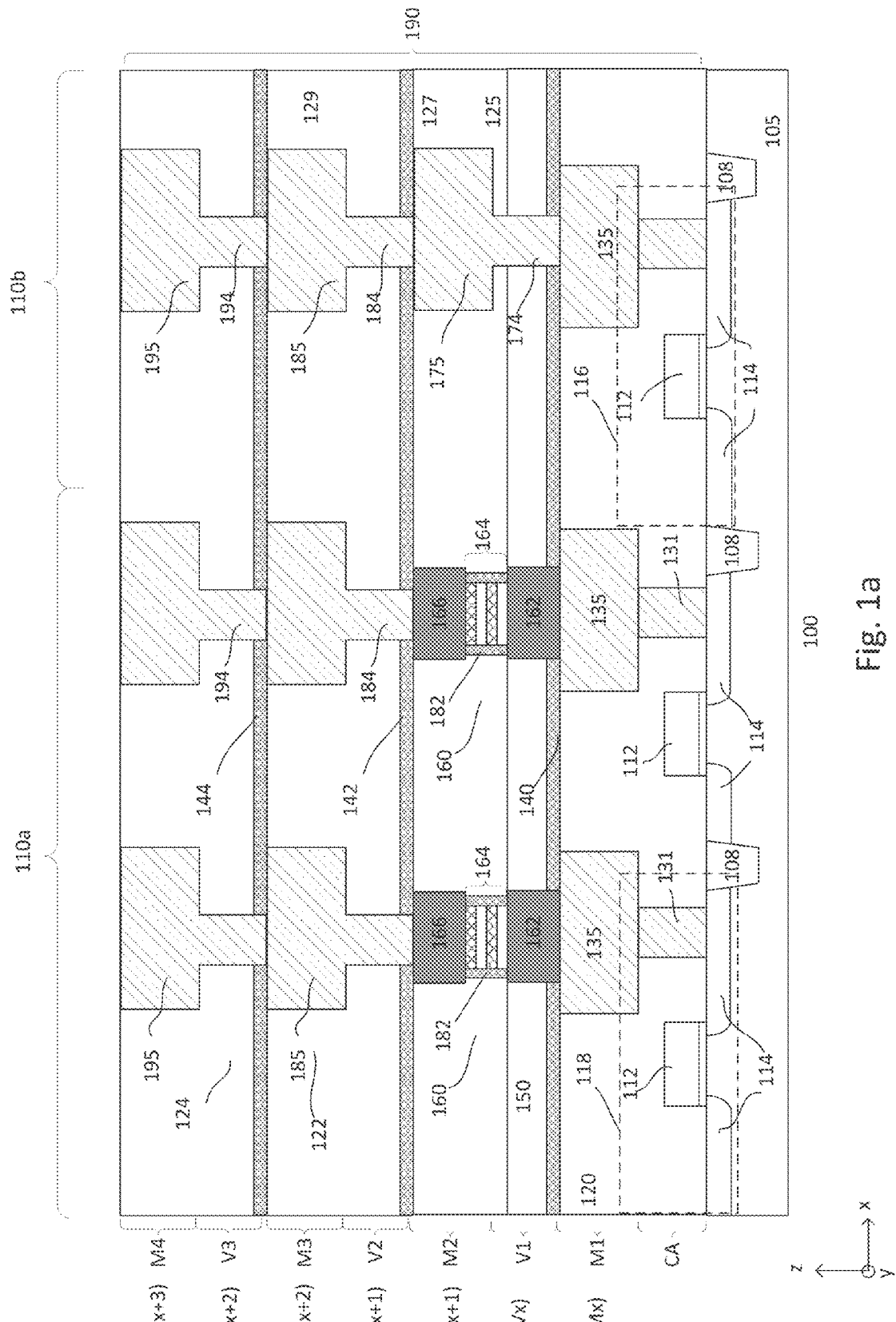
FIG. 1a shows cross-sectional views of logic and memory regions of an embodiment of a device and FIG. 1b shows enlarged cross-sectional views of logic and memory portions of the device.
Figure 1B:
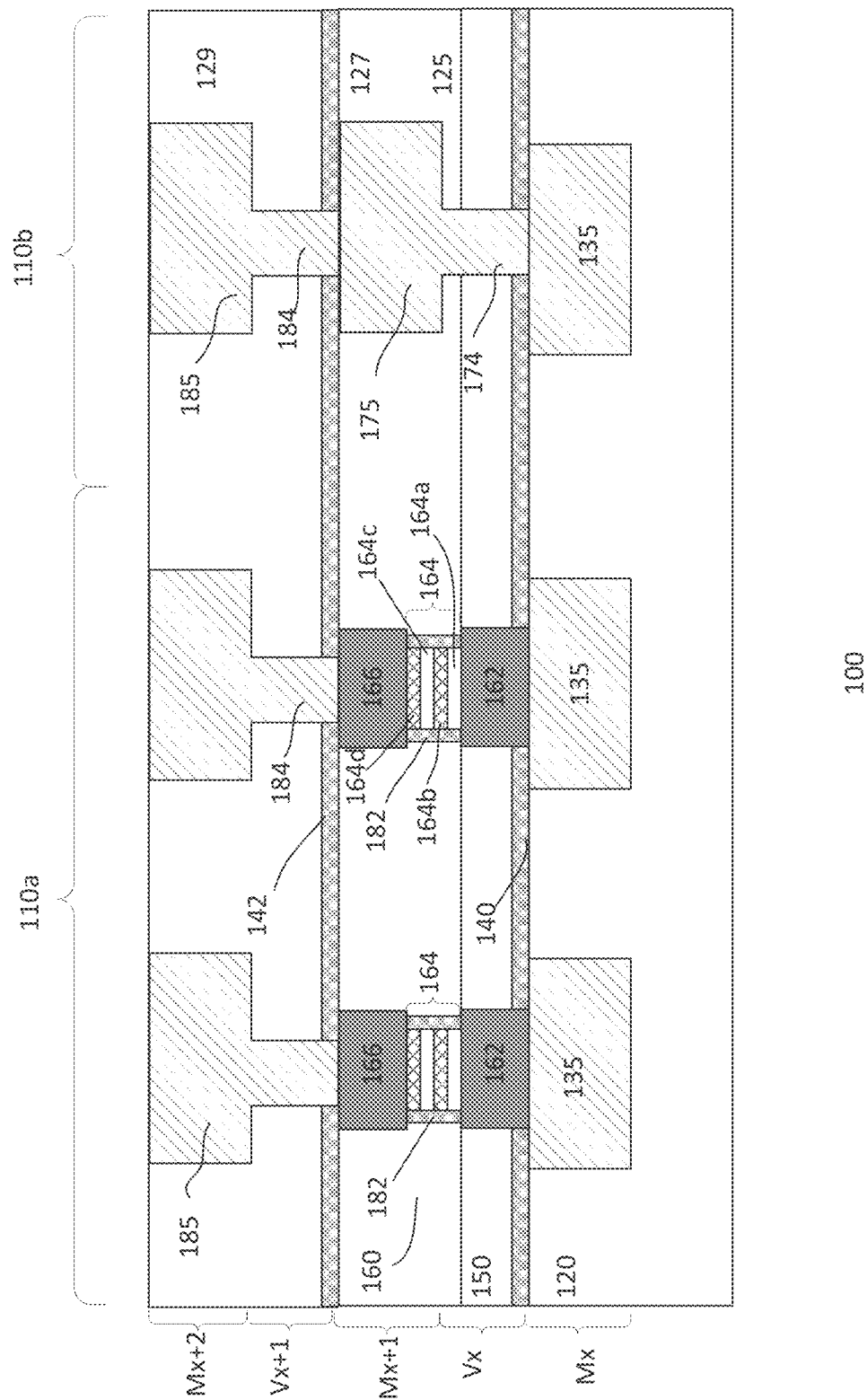

FIG. 1a shows cross-sectional views of first region 110a and second region 110b of an embodiment of a device 100. FIG. 1b shows enlarged cross-sectional view of ILD levels having tight pitch of the first and second regions of the device 100. The first region 110a may be referred to as the memory region and the second region 110b may be referred to as the logic region. The cross-sectional view, for example, is along a bitline (or x) direction of the device. The device 100, as shown, includes one or more memory cells having a cell selector units or transistors and one or more logic transistors. The memory cell, for example, may be a non-volatile memory (NVM) cell. The memory cell, in one embodiment, is a magnetoresistive NVM cell, such as a STT-MRAM cell.

The cell select unit of the memory cell and the logic transistor of the logic component are disposed on a substrate 105. For example, the memory cell selector unit 118 is disposed in the first (or memory) region 110a and the logic transistor 116 is disposed in the second (or logic) region 110b of the same substrate. The first region 110a is a memory cell region which may be part of an array region. For example, the array region may include a plurality of cell regions. The substrate may also include other types of device regions (not shown).

The substrate, for example, is a semiconductor substrate, such as a silicon substrate. For example, the substrate may be a lightly doped p-type substrate. Providing an intrinsic or other types of doped substrates, such as silicon-germanium (SiGe), germanium (Ge), gallium-arsenic (GaAs) or any other suitable semiconductor materials, may also be useful. In some embodiments, the substrate may be a crystalline-on-insulator (COI) substrate. A COI substrate includes a surface crystalline layer separated from a bulk crystalline by an insulator layer. The insulator layer, for example, may be formed of a dielectric insulating material. The insulator layer, for example, is formed from silicon oxide, which provides a buried oxide (BOX) layer. Other types of dielectric insulating materials may also be useful. The COI substrate, for example, is a silicon-on-insulator (SOI) substrate. For example, the surface and bulk crystalline layers are single crystalline silicon. Other types of COI substrates may also be useful. It is understood that the surface and bulk layers need not be formed of the same material.

Front end of line (FEOL) processing is performed on the substrate. The FEOL process, for example, forms n-type and p-type devices or transistors in the memory region 110a, the logic region 110b as well as other regions on the substrate. The p-type and n-type device form a complementary MOS (CMOS) device. The FEOL processing, for example, includes forming isolation regions, various device and isolation wells, transistor gates and transistor source/drain (S/D) regions and contact or diffusion regions serving as substrate or well taps. Forming other components with the FEOL process may also be useful.

As shown, the FEOL processing forms at least a memory cell region 110a and logic region 110b isolated by isolation regions 108, such as shallow trench isolation (STI) regions. The memory cell region is for one or more memory cells. Isolation regions may be provided to isolate columns of memory cells. Other configurations of isolation regions may also be useful. The first region 110a may include a cell device well (not shown) while the second region 110b may include a logic device well (not shown). The cell device well, for example, serves as a body well for a cell select transistor 118 of the memory cell while the logic device well, for example, serves as a body well for the logic transistor. The device wells may be doped with second polarity type dopants for first polarity type transistors. The device wells may be lightly or intermediately doped with second polarity type dopants. In some cases, a device isolation well (not shown) may be provided, encompassing the device well. The isolation well may have a dopant type which has the opposite polarity to that of the device well. For example, the isolation well may include first polarity type dopants. The isolation well serves to isolate the device well from the substrate. Well biases may be provided to bias the wells.

As shown, the first region includes a cell selector unit 118 while the second region includes a logic transistor 116. The cell selector unit includes a selector for selecting the memory cell. The selector, for example, may be a select transistor. In one embodiment, the select and logic transistors are metal oxide semiconductor (MOS) transistors. Thus, the FEOL processing forms the cell selector transistor in the first region and the logic transistor in the second region. The transistors, as shown, include first and second source/drain (S/D) regions 114 formed in the substrate and a gate 112 disposed on the substrate between the S/D regions. The S/D regions, for example, are heavily doped regions with first polarity type dopants, defining the first type transistor. For example, in the case of a n-type transistor, the S/D regions are n-type heavily doped regions. Other types of transistors or selectors may also be useful. As for the gate, it includes a gate electrode over a gate dielectric. The gate electrode may be polysilicon while the gate dielectric may be silicon oxide. Other types of gate electrode and gate dielectric materials may also be useful. A gate, for example, may be a gate conductor along a wordline (or y) direction. The gate conductor forms a common gate for a row of cells.

A S/D region 114 may include LDD and halo regions (not shown). Dielectric spacers (not shown) may be provided on the gate sidewalls of the transistor to facilitate forming transistor halo, LDD and transistor S/D regions. It is understood that not all transistors include LDD and/or halo regions.

After forming the cell selector unit in the first region and logic transistor in the second region and other transistors (not shown) in other device regions, back end of line (BEOL) processing is performed. The BEOL process includes forming interconnects in interlevel dielectric (ILD) layers. The interconnects connect the various components of the IC to perform the desired functions. An ILD level includes a metal level 122 and a contact level 124. Generally, the metal level includes conductors or metal lines while the contact level includes via contacts. The conductors and contacts may be formed of a metal, such as copper, copper alloy, aluminum, tungsten or a combination thereof. Other suitable types of metal, alloys or conductive materials may also be useful. In some cases, the conductors and contacts may be formed of the same material. For example, in upper metal levels, the conductors and contacts may be formed by dual damascene processes. This results in the conductors and contacts having the same material. In some cases, the conductors and contacts may have different materials. For example, in the case where the contacts and conductors are formed by single damascene processes, the materials of the conductors and contacts may be different. Other techniques, such as reactive ion etch (RIE) may also be employed to form metal lines.

A device may include a plurality of ILD layers or levels 190 formed by the BEOL processing. For example, n number of back end ILD levels may be provided. As illustrated, the device includes 4 ILD levels (n=4). Other suitable number of ILD levels may also be useful. The number of ILD levels may depend on, for example, design requirements or the logic process involved. A metal level of an ILD level may be referred to as $M_i$, where i is from 1 to n and is the $i^{th}$ ILD level of n ILD levels. A contact level of an ILD level may be referred to as $V_{i-1}$, where i is the $i^{th}$ ILD level of n ILD levels.

The BEOL process, for example, commences by forming a dielectric layer over the transistors and other components formed in the FEOL process. The dielectric layer may be silicon oxide. For example, the dielectric layer may be silicon oxide formed by chemical vapor deposition (CVD). The dielectric layer serves as a premetal dielectric layer or first contact layer of the BEOL process. The dielectric layer may be referred to as CA level of the BEOL process. Contacts are formed in the CA level dielectric layer. The contacts may be formed by a single damascene process. Via openings are formed in the dielectric layer using mask and etch techniques. For example, a patterned resist mask with openings corresponding to the vias is formed over the dielectric layer. An anisotropic etch, such as RIE, is performed to form the vias, exposing contact regions below, such as S/D regions and gates. A conductive layer, such as tungsten is deposited on the substrate, filling the openings. The conductive layer may be formed by sputtering. Other techniques may also be useful. A planarization process, such as chemical mechanical polishing (CMP), is performed to remove excess conductive material, leaving contact plugs in the CA level.

After forming contacts in the CA level, the BEOL process continues to form dielectric layer over the substrate, covering the CA level dielectric layer. The dielectric layer, for example, serves as a first metal level M1 of the first ILD layer. The first ILD layer, for example, is formed of a low-k dielectric material. Preferably, the first ILD layer is an ultra low-k dielectric layer, such as SiCOH. Other suitable types of low-k dielectric materials may also be useful. The dielectric layer may be formed by CVD. Other suitable techniques for forming the first ILD layer may also be useful.

Conductive or metal lines are formed in the M1 level dielectric layer. The conductive lines may be formed by a damascene technique. For example, the dielectric layer may be etched to form trenches or openings using, for example, mask and etch techniques. A conductive layer is formed on the substrate, filling the openings. For example, a copper or copper alloy layer may be formed to fill the openings. The conductive material may be formed by, for example, plating, such as electro or electroless plating. Other types of conductive layers or forming techniques may also be useful. Excess conductive materials are removed by, for example, CMP, leaving planar surface with the conductive line and M1 level dielectric layer. The first metal level M1 and CA may be referred as a lower ILD level.

The process continues to form additional or upper ILD layers/levels. The additional ILD levels may include ILD level 2 to ILD level n. For example, in the case where n=4 (4 levels), the upper ILD level includes ILD levels from 2 to 4, which includes via levels V1 to V3 and metal levels M2 to M4. Designating other ILD levels as upper ILD level may also be useful. The number of ILD levels may depend on, for example, design requirements or the logic process involved. The ILD layers, in one embodiment, are formed of low-k dielectric materials. Preferably, the ILD layers of ILD levels 2 to 4 include ultra low-k dielectric layers, such as SiCOH. Other suitable types of low-k dielectric materials may also be useful. The ILD layers may be formed by, for example, CVD. Other techniques for forming the ILD layers may also be useful.

The conductors and contacts of the additional ILD layers may be formed by dual damascene techniques. For example, vias and trenches are formed, creating dual damascene interconnect structures. The dual damascene structure may be formed by, for example, via first or via last dual damascene techniques. Mask and etch techniques may be employed to form the dual damascene structures. The dual damascene structures are filled with a conductive layer, such as copper or copper alloy. The conductive layer may be formed by, for example, plating techniques. Excess conductive material is removed by, for example, CMP, forming conductors/metal lines and contacts in an ILD layer.

Dielectric liners 140, 142, 144 may be disposed between ILD levels and on the substrate. The dielectric liner, for example, serves as an etch stop layer. The dielectric liner may be formed of a low k dielectric material. For example, the dielectric liner may be NBLoK or SiN. Other types of dielectric materials for the dielectric liner may also be useful.

The uppermost ILD level (e.g., M4) may have the same or different design rules, such as critical dimension (CD), than the lower ILD levels. In the case where the uppermost ILD has a larger design rule, the uppermost ILD level may have a larger CD than metal levels below. For example, the uppermost metal level may have a CD which is 2× or 4× the CD of the metal levels below.

As shown, S/D contacts 131 are disposed in the CA level. The S/D contacts are coupled to the first and second S/D regions of the transistors in the first and second regions. Other S/D contacts coupled to other S/D regions of transistors may also be provided. The CA level may include a gate contact (not shown) coupled to the gate of the transistor. The gate contact may be disposed in another cross-section of the device. The gate contact is coupled to a wordline (WL) which may be provided by the gate or provided in any suitable metal level. The contacts may be tungsten contacts. Other types of contacts may also be useful. Other S/D and gate contacts for other transistors may also be provided.

As described, metal lines are provided in M1. The metal lines are coupled to the S/D contacts. As an example, a source line (not shown) is coupled to the second S/D region of the select transistor. As for the first S/D contact, it may be coupled to a contact pad or island in M1. The contact pad provides connections to upper ILD levels. The metal lines or pads may be formed of copper or copper alloy. Other types of conductive materials may also be useful.

As for the additional or upper ILD levels, for example, from 2 to 4, they include via contacts (e.g., 174, 184, 194) in the via level and contact pads/metal lines (e.g., 175, 185, 195) in the metal level. The contacts and contact pads provide connection from M4 to the first S/D region of the transistors in the first and second regions.

As shown in FIG. 1a, the first region 110a accommodates one or more MRAM cells and the second region 110b accommodates a logic component. In one embodiment, the MRAM cell includes a storage or memory element which is disposed in between ILD levels having tight pitch. For example, one or more ILD layers of the back end ILD layers 190 have tight pitch of which interconnects therein are defined at the minimum line resolution of the lithography and etch capability for a technology process node, which may be referred to as 1× design rule. Metal levels with 1× design rules may also be referred to asthin wire levels. For example, y number of the plurality of ILD levels may be defined at 1× design rule. The number of ILD levels defined with 1× design rule may depend on, for example, design requirements or the logic process involved.

In one embodiment, the memory element may be disposed in any suitable ILD levels with tight pitch (e.g., defined at 1× design rule). In the present disclosure, the ILD level of which the memory element disposed thereon may be referred to as a first ILD level with tight pitch and its metal level may be referred to as Mx (x=1, 2, 3, etc.). The immediate ILD level overlying the metal level Mx may be referred to as a second ILD level with tight pitch which includes via level Vx and metal level Mx+1 and the next overlying ILD level may be referred to as a third ILD level having via level Vx+1 and metal level Mx+2, etc. In one embodiment, at least the first and second ILD levels are ILD levels with tight pitch. For example, the first and second ILD levels may be 1× levels. As shown, the via level Vx connects metal level Mx to Mx+1, the via level Vx+1 connects the metal level Mx+1 to Mx+2, etc. In one embodiment, the memory element of the memory cell is disposed in between Mx and Vx+1. In one example, the memory or storage element may be disposed over M1 and is disposed in between M1 and V2 as shown in FIG. 1a.

As described, the memory element may be disposed on any suitable ILD level with tight pitch (e.g., defined at 1× design rule). FIG. 1b shows the enlarged cross-sectional view of the logic and memory portions of the device shown in FIG. 1a which illustrates a dielectric layer 120 corresponding to the ILD level having metal level Mx (x=1, 2, 3, etc.) of which the memory element is disposed thereon. For the sake of simplicity and illustration purpose, the dielectric layer 120 in this disclosure may be referred to as a first ILD level having tight pitch and its via and metal levels may be referred to as a first interconnect level. As shown in the first and second regions, metal lines 135 are disposed in the metal level Mx (x=1, 2, 3, etc.) of the dielectric layer 120. The metal line 135, for example, may be referred to as a lower interconnect of the ILD levels with tight pitch in the first and second regions. The metal line 135 in the first region, for example, is coupled to a MTJ element of the MRAM cell which will be described later. The metal line 135 in the first region, for example, may be used for connection purpose and couples the MTJ element to the first S/D region of the select transistor 118. The metal line 135 in the second region, for example, is coupled to the first S/D region of the logic transistor 116 disposed on the substrate. Although three metal lines are shown in the first and second regions, it is understood that there could be other suitable number of metal lines in the same metal level of the first and second regions.

The metal lines 135 include a conductive material. The conductive material, for example, includes copper (Cu). Other suitable types of conductive material may also be useful. The dimensions of this metal line 135 and its underlying via contact, for example, are defined at the minimum line resolution of the lithography and etch capability for a technology process node, which may be referred to as 1× design rule. The thickness of the metal lines 135 with reference to the top surface of the dielectric layer 120, for example, is about 850-1000 Å. Other suitable thickness dimensions may also be useful, depending on the design requirements of a technology node.

A dielectric liner 140 is disposed above the dielectric layer 120 in the first and second regions 110a-110b and covers the metal lines 135 in the first and second regions. The dielectric liner, for example, serves as an etch stop layer. The dielectric liner may be a low k dielectric liner. For example, the dielectric liner may be NBLoK. Other suitable types of dielectric materials for the dielectric liner may also be useful.

A second dielectric layer 150 is disposed on the dielectric layer 120. For example, the second dielectric layer is disposed on the dielectric liner 140. The dielectric layer 150, in one embodiment, includes a low-k dielectric material. For example, the low-k dielectric material includes a low-k dielectric layer, such as SiCOH. Other suitable dielectric materials and thicknesses for the second dielectric layer may also be useful.

The second dielectric layer 150, in one embodiment, includes trenches in the first region. The trench in the first region, for example, accommodates a bottom electrode of a storage element of the MRAM cell as will be described later. The trench in the first region, for example, extends from the top surface of the dielectric layer 150 to the top surface of the metal line 135. The shape of the trench or opening, for example, may have a rectangular shape. Other shapes for the opening, such as circular, may also be useful.

In the first region 110a, storage elements 160 of the MRAM cell are disposed over the dielectric layer 150. In one embodiment, the MRAM cell is a STT-MRAM cell and the storage element includes a magnetic tunnel junction (MTJ) element. Other suitable types of storage elements or memory cells may also be useful.

The storage element 160 includes first and second electrodes. The first electrode, for example, may be a bottom electrode 162 while the second electrode may be a top electrode 166. The bottom electrode 162 of the memory element is disposed in the trench in the dielectric layer 150 and is connected to the metal line 135. The bottom electrode 162, in one embodiment, extends through the dielectric layer 150 and dielectric liner 140 and is directly coupled to the metal line 135 in the first region.

The storage element includes a MTJ stack 164 disposed in between the top and bottom electrodes. The storage element, for example, may include a bottom-pinned MTJ element or a top-pinned MTJ element. The bottom-pinned MTJ element is formed by having the magnetically fixed layer disposed below the magnetically free layer while the top pinned MTJ element is formed by having the fixed layer disposed above the free layer. For illustration purpose, the MTJ stack includes four layers. It is understood that the MTJ stack may include other suitable number of layers. The MTJ stack generally includes a magnetically fixed (pinned) layer 164a, one or more tunneling barrier layers 164b and 164d and a magnetically free layer 164c. The fixed layer includes a magnetic layer and a pinning layer. The pinning layer, for example, pins the magnetization direction of the magnetic layer, forming a pinned layer.

By way of example, the free layer and the fixed layer may be CoFeB or CoFe based composite material and the tunneling barrier layer may be MgO or $Al_2O_3$. As for the pinning layer, it may be PtMn or IrMn. In one embodiment, the top and bottom electrodes may be Ti, TiN, Ta, TaN or other suitable metals used in the semiconductor process. Other suitable configurations or materials of storage or memory element may also be useful.

The top electrode 166, in one embodiment, is disposed over the layers of the MTJ stack. The layers of the MTJ stack 164 of the memory cell, for example, may have sidewalls that are aligned with each other and include a length dimension which is smaller than a length dimension of the bottom electrode 162. In other embodiments which are not shown herein, the upper layers of the MTJ stack of the memory cell may have a length dimension which is smaller than a length dimension of the lower layers of the MTJ stack and bottom electrode. Other suitable configurations for the top electrode and MTJ stack may also be useful.

In one embodiment, an encapsulation liner in the form of vertical dielectric spacers 182 may line exposed side surfaces of the MTJ stack in the first region. The encapsulation liner 182 may be a low k dielectric liner. For example, the low k dielectric liner may be SiN. Other suitable types of dielectric materials for the encapsulation liner may also be useful.

A third dielectric layer 125 and a fourth dielectric layer 127 are disposed over the second dielectric layer 150. The dielectric layers 125 and 127, for example, cover the storage elements in the first region and include trenches to accommodate the top electrodes 166 over the MTJ stacks. The dielectric layers 125, 127 and 150, for example, may correspond to a second ILD level having tight pitch. The dielectric layers 125 and 127 include low-k dielectric material. Preferably, the dielectric layers include low-k dielectric layer, such as SiCOH. Other suitable configurations and materials for the dielectric layers may also be useful.

The second ILD level includes a dual damascene interconnect structure in the second region 110b. For example, the dielectric layers 125 and 150 accommodate a via contact 174 which couples a metal line 175 or second upper interconnect to the lower interconnect 135 in the logic region 110b. The metal line 175 is disposed in the metal level while the via contact 174 is disposed in the via level of the second ILD level. For simplicity, the via and metal levels of the second ILD level may be referred to as a second interconnect level. For example, the metal line 175 may be disposed in metal level Mx+1 while the via contact 174 may be disposed in via level Vx. Although one metal line is shown for the second region in metal level Mx+1, it is understood that there could be other suitable number of metal lines in the same metal level of the second region.

The dimensions of the metal line 175 and the via contact 174, for example, may be defined at the minimum line resolution of the lithography and etch capability for a technology process node, which may be referred to as 1× design rule. For example, the thickness of the metal line 175, for example, may be the same as the thickness of the metal line 135 below. The via contact 174, as shown in FIG. 1b, couples the metal line 175 in metal level Mx+1 to the metal line 135 in lower metal level Mx. The via contact 174 in the second region, for example, extends through the dielectric layers 125 and 150 and dielectric liner 140. The via contact in via level Vx and metal line in metal level Mx+1 include a conductive material, such as Cu. Other suitable configurations and conductive materials for the via contact and metal line may also be useful.

A fifth dielectric layer 129 and a dielectric liner 142 are disposed over the second ILD level having tight pitch. The dielectric layer 129, for example, covers the storage elements in the first region and dual damascene interconnect in the second region. The dielectric layer 129, for example, may be referred to as a third ILD level. The dielectric layer 129 includes low-k dielectric material and the dielectric liner 142 includes SiN. Preferably, the dielectric layer includes a low-k dielectric layer, such as SiCOH. Other suitable configurations and materials for the dielectric layer and dielectric liner may also be useful.

The third ILD level includes dual damascene interconnect structures in the first and second regions. For example, the dielectric layer 129 includes via contact 184 which couples a metal line 185 or third interconnect to the top electrode 166 over the MTJ stack in the memory region 110a and includes via contact 184 which couples a metal line 185 to the underlying interconnect 175 in the logic region 110b. The metal line 185 is disposed in the metal level while the via contact 184 is disposed in the via level of the third ILD level. For simplicity, the via and metal levels of the third ILD level may be referred to as a third interconnect level. For example, the metal line 185 may be disposed in metal level Mx+2 while the via contact 184 may be disposed in via level Vx+1. Although three metal lines are shown for the first and second regions in metal level Mx+2, it is understood that there could be other suitable number of metal lines in the same metal level of the first and second regions.

The dimensions of the metal line 185 and the via contact 184, for example, may be defined at the minimum line resolution of the lithography and etch capability for a technology process node (e.g., 1× design rule). For example, the thickness of the metal line 185, for example, may be the same as the thickness of the metal line 135 below. In other embodiments, the metal line 185 and via contact 184, for example, may be defined at different design rule than the metal line 135 below. However, the design rule may be constrained by the design rule or pitch of the MTJ stack. For example, if the MTJ stack has a relaxed pitch, then the metal line and via contact may have a relaxed pitch.

The via contact 184 in via level Vx+1, as shown in FIG. 1b, couples the metal line 185 in metal level Mx+2 to the top electrode 166 in the memory region 110a. The metal line 185 in the memory region, for example, may serve as a bitline (BL). In such case, the metal line in Mx+2 serves as a bit line and provides electrical connection to the storage element 160. Providing the bitline at other metal level may also be useful. The via contact 184 in via level Vx+1 in the second region 110b, as shown, couples the metal line 185 to the metal line 175 in lower metal level Mx+1. The via contacts 184 in the first and second regions, for example, extend through the dielectric layer 129 and dielectric liner 142. The via contact in via level Vx+1 and metal line in metal level Mx+2 include a conductive material, such as Cu. Other suitable configurations and conductive materials for the via contact and metal line may also be useful.

In one embodiment, the total height of the MTJ stack with the top and bottom electrodes in the first region 110a may take into consideration the total height of the metal line in metal level Mx+1 and via contact in via level Vx defined at tight pitch (e.g., 1× design rule) in the logic region 110b. For example, the total height of the MTJ stack with the top and bottom electrodes may be the same or slightly shallower than the total height of the metal line in Mx+1 and via contact in Vx. For example, the height of the top and bottom electrodes may be adjusted to make the overall MTJ height of the MTJ stack to be the same as Mx+1 and Vx. For example, in the case that Mx+1 and Vx is <5 nm, the top and bottom electrodes may be adjusted so that it is <5 nm.

Referring to FIG. 1b, the storage element of the memory cell is disposed in between metal level Mx and metal level Mx+2. More particularly, the storage element of the memory cell is disposed in between metal level Mx and via level Vx+1. The metal lines in Mx+2 and via contacts in Vx+1 provide electrical connection to the storage element in the first region. In such configuration, the storage element having a total height greater than the via height Vx can be safely inserted in ILD level having tight pitch (e.g., defined at 1× design rule) without any reliability concern.

As described, metal level Mx may be any suitable metal level of an ILD level having tight pitch. By way of an example, if Mx refers to metal level M1, the storage element is disposed between M1 and V2 as illustrated in FIG. 1a. In such case, the metal lines in M3 and via contacts in V2 provide electrical connection to the storage element. In another example not illustrated herein, if Mx refers to metal level M2, the storage element is disposed between M2 and V3 of which metal lines in M4 and via contacts in V3 provide electrical connection to the storage element.

Referring back to FIG. 1a, a pad level (not shown) may be disposed over the uppermost ILD level. In the case where the device includes 4 metal levels, the pad level is disposed over metal lines 195 of metal level M4 which are coupled to via contacts 194 of via level V3. The pad dielectric layer, for example, may be silicon oxide. Other types of dielectric materials may also be useful. The pad dielectric layer includes pads, such as bond pads or pad interconnects for providing external interconnections to the components. Bond pads may be used for wire bonding while pad interconnects may be provided for contact bumps. The external interconnections may be input/output (I/O), power and ground connections to the device. The pads, for example, may be aluminum pads. Other types of conductive pads may also be useful. A passivation layer, such as silicon oxide, silicon nitride or a combination thereof, may be provided over the pad level. The passivation layer includes openings to expose the pads.

Figure 2A:
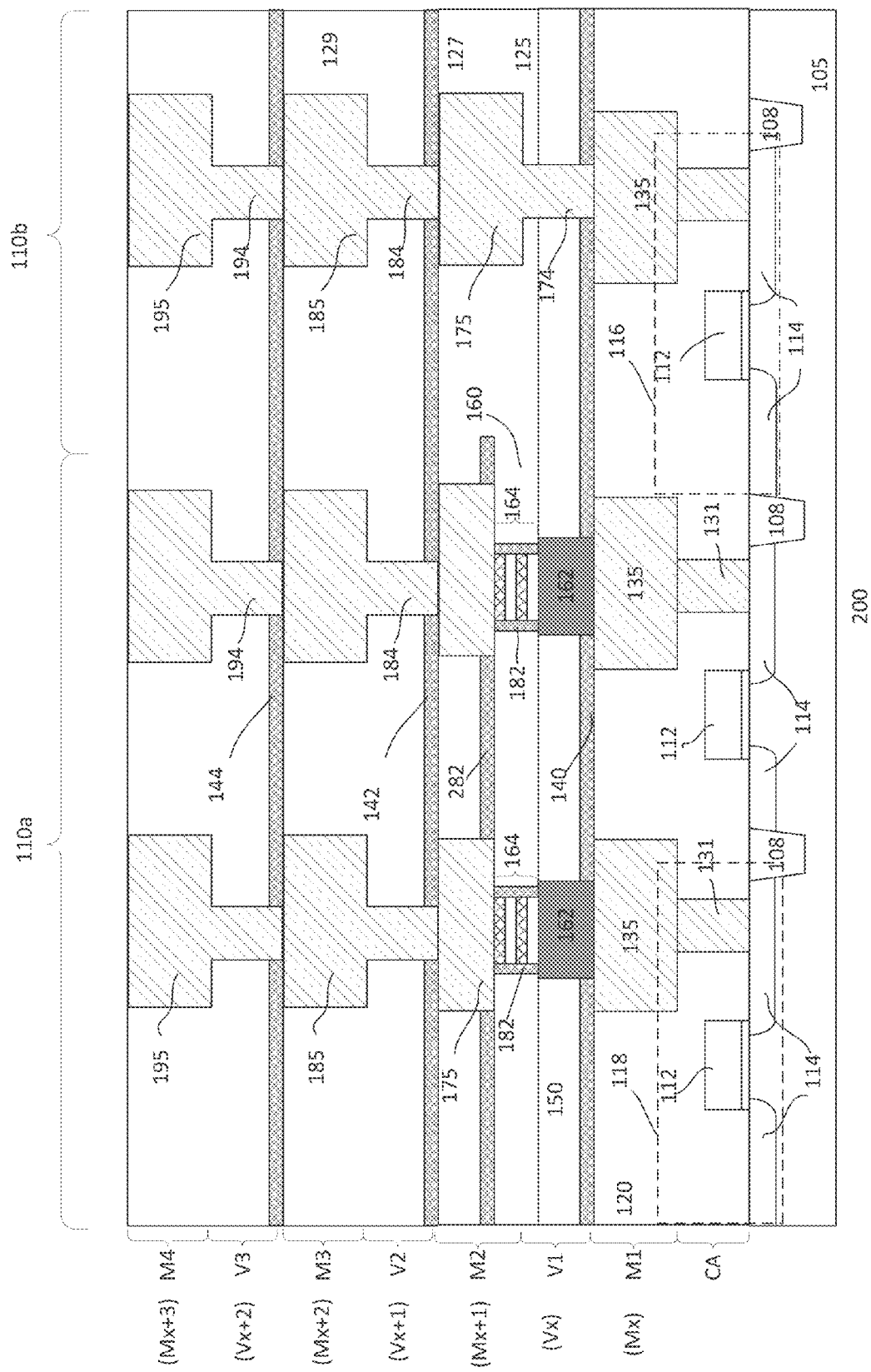
FIG. 2a shows cross-sectional views of logic and memory regions of another embodiment of a device and FIG. 2b shows enlarged cross-sectional views of logic and memory portions of the device.
Figure 2B:
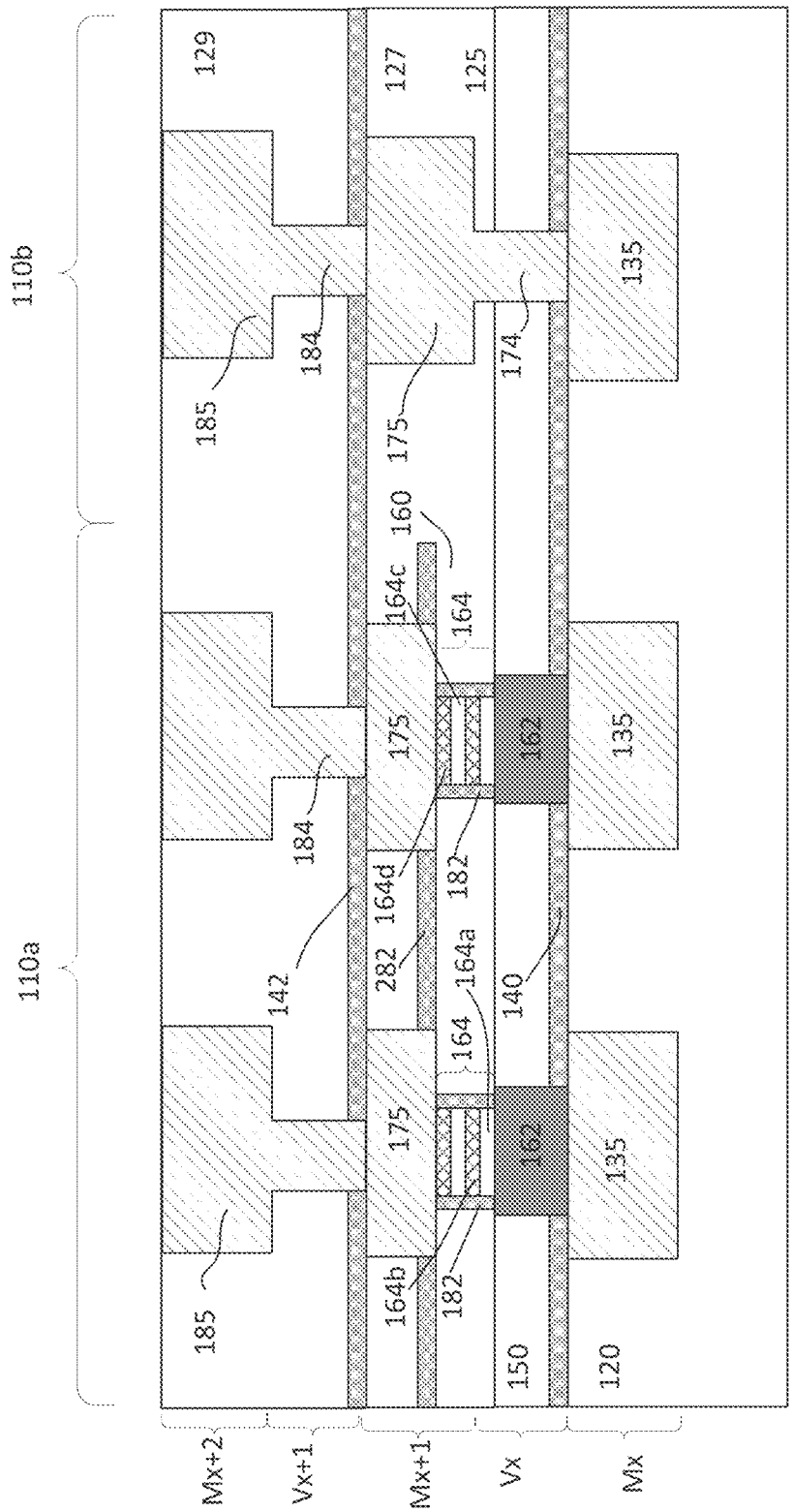

FIG. 2a shows cross-sectional views of first (or memory) region 110a and second (or logic) region 110b of another embodiment of a device 200. FIG. 2b shows enlarged cross-sectional view of ILD levels having tight pitch of the first and second regions of the device 200. The device 200, for example, is similar to the device 100 as described in FIGS. 1a-1b. Common elements and features having the same reference numerals may not be described or described in detail. In the interest of brevity, the description of the device 200 below primarily focuses on the difference(s) compared with the device 100 shown in FIGS. 1a-1b.

As shown in FIGS. 2a-2b, the device 200 includes a storage element 160 disposed in between metal lines in metal level Mx and via contact in via level Vx+1. In one embodiment, the device 200 differs from the device 100 in that the top surface of the MTJ stack in the memory region is coupled to a metal line 175 having the same material as the metal line 175 in metal level Mx+1 in the logic region. The metal line 175 disposed in metal level Mx+1 in the memory region 110a provides electrical connection to the MTJ stack. In one embodiment, the device 200 includes a dielectric liner 282 which is disposed in the memory region 110a and in between dielectric layers 127 and 125. The dielectric liner 282 includes the same material as the dielectric spacers 182 and serves as an etch stop layer to allow metal lines 175 to be formed simultaneously in the memory and logic regions in metal level Mx+1 as will be described in detail with respect to FIGS. 4a-4f later.

In one embodiment, the total height of the MTJ stack with the top and bottom electrodes in the memory region 110a may take into consideration the total height of the metal line in metal level Mx+1 and via contact in via level Vx defined at tight pitch (e.g., 1× design rule) in the logic region 110b. For example, the total height of the MTJ stack with bottom electrode may be shallower than the total height of the metal line 175 in Mx+1 and via contact 174 in Vx in the logic region. Referring to FIG. 2b, the storage element of the memory cell is disposed in between metal level Mx and via level Vx+1. As described, the metal line 175 in Mx+1 disposed over the MTJ stack in the memory region provides electrical connection to the storage element. The presence of the dielectric liner 282 which serves as an etch stop layer in the memory region allows metal line 175 to be formed over the MTJ stack without causing electrical short between the metal line 175 in Mx+1 and bottom electrode 162 of the memory cell in the memory region. Thus, the storage element having a total height greater than the via height Vx of the logic region can be safely inserted in ILD level having tight pitch (e.g., defined at 1× design rule) without any reliability concern.

FIGS. 3a-3g show simplified cross-sectional views of a process 300 for forming an embodiment of a device. The cross-sectional views of the process 300 are taken along first (or memory) region 110a and second (or logic) region 110b of the device. In one embodiment, the process allows one or more memory cells to be formed with logic components on the same substrate using logic processing. The process 300 which forms the memory cells together with the logic components are generally based on any suitable technology node (including but not limited to 28 nm technology node) where low-k dielectric layers are used in back-end-of-line (BEOL) processing. The memory cell, for example, may be a MRAM cell. The MRAM, in one embodiment, is a STT-MRAM cell. The device formed, for example, is similar or the same as that shown and described in FIGS. 1a-1b. As such, common elements may not be described or described in detail.

Figure 3A:
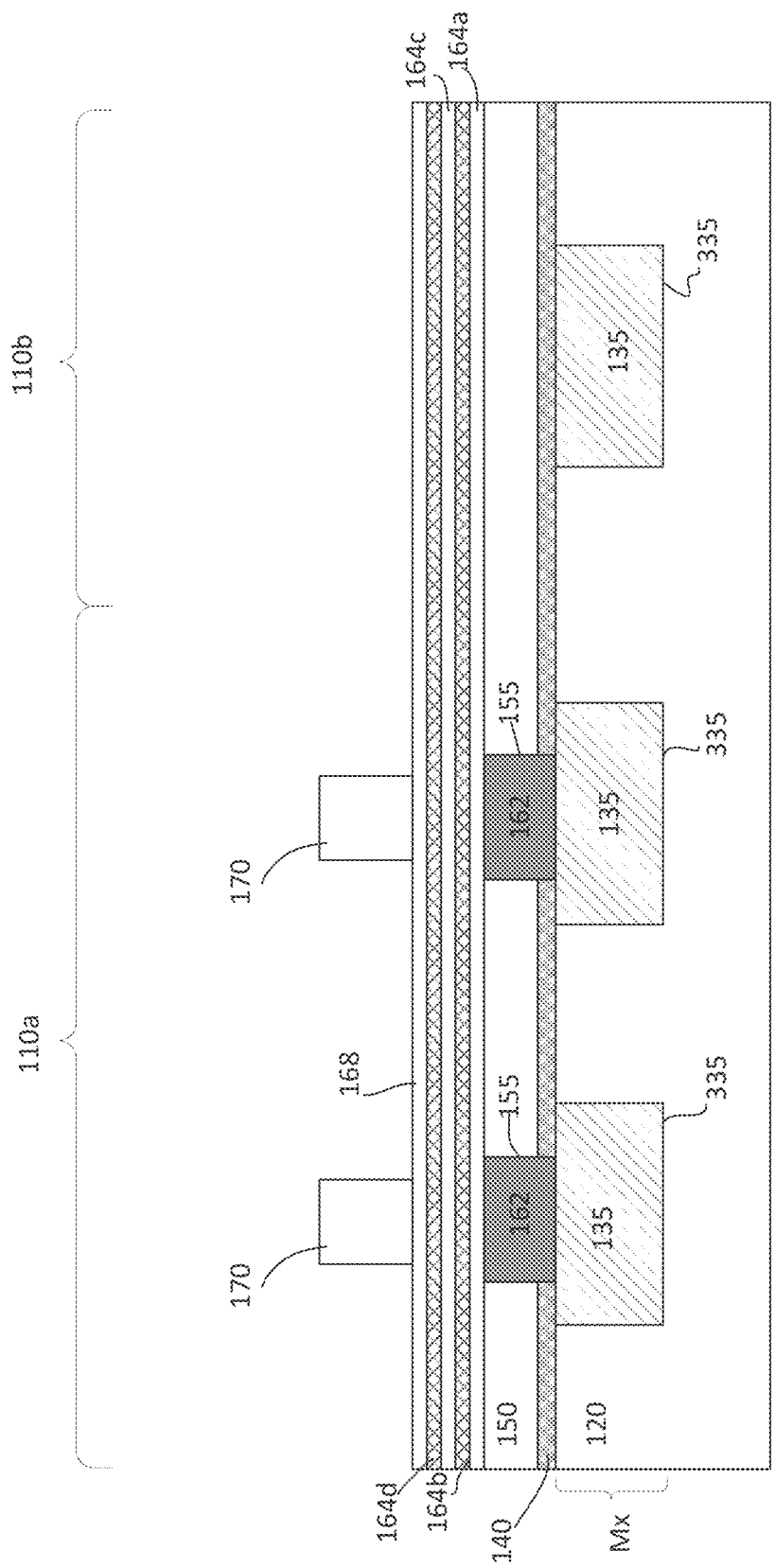

For simplicity, the processing of a substrate to form transistors using FEOL and processing of lower ILD level using BEOL are not shown. Referring to FIG. 3a, the process 300 is at the stage of providing a dielectric layer 120 over a substrate (not shown). The dielectric layer 120 may correspond to the ILD level having metal level Mx (x=1, 2, 3, etc.) of which memory elements are formed thereon. For simplicity and illustration purposes, the dielectric layer 120 in this disclosure may be referred to as a first ILD level having tight pitch (e.g., defined at 1× design rule) and its metal level via and metal levels may be referred to as a first interconnect level. The dielectric layer 120 is formed of a low-k dielectric material. Preferably, the dielectric layer 120 includes an ultra low-k dielectric layer, such as SiCOH. Other suitable low-k dielectric materials may also be useful.

The process includes forming suitable via openings (not shown) and trenches in the first (or memory) region 110a and second (or logic) region 110b. Trenches 335 are formed in the dielectric layer 120 of the first and second regions 110a and 110b. A photoresist (not shown) is applied to the top surface of the dielectric layer 120 to define a pattern arrangement for fabricating the trenches. Portions of the dielectric layer not protected by the photoresist are removed (e.g., by using an etching process) to form the trenches. The etching process, for example, may be an anisotropic etch, such as RIE. Other suitable removal processes may also be employed.

In one embodiment, the trenches 335 in the first and second regions are formed simultaneously. The trenches, for example, include the same depth dimension defined by, for example, 1× design rule. The depth of the trenches, for example, may be about 850-1000 Å with reference to the top surface of the dielectric layer 120 based on 28 nm technology node. Other suitable depth dimensions may also be useful, depending on design requirement of a technology node.

The process continues by depositing a conductive layer on top of the dielectric layer 120 and filling the trenches 335. The conductive layer, for example, may be formed by chemical vapor deposition (CVD). The conductive layer, for example, includes Cu. Other suitable conductive materials and deposition techniques may also be employed. A chemical mechanical polishing (CMP) process is performed to remove excess conductive material on top of the dielectric layer 120 and to provide a substantially planar surface. The trenches filled with conductive material form metal lines 135 in metal level Mx of the first and second regions. Although three metal lines are shown in the first and second regions, it is understood that there could be other suitable number of metal lines being formed in the same metal level of the first and second regions. The metal line 135 in the first region 110a may be coupled to a MTJ element which will be formed in subsequent processing while the metal line 135 in the second region 110b may be coupled to an upper interconnect of overlying metal level. As shown, the process forms metal lines 135 in the first and second regions simultaneously in a metal level (e.g., Mx) of the device.

Referring to FIG. 3a, a dielectric liner 140 is formed above the dielectric layer 120 covering the metal lines 135 in the first and second regions. The dielectric liner, for example, serves as an etch stop layer. The dielectric liner may be a low k dielectric liner. For example, the dielectric liner may be NBLoK. Other suitable types of dielectric materials for the dielectric liner may also be useful. The dielectric liner, for example, is formed by CVD. Other suitable techniques for forming the dielectric liner may also be useful.

The process continues to form a second dielectric layer 150. As shown in FIG. 3a, the dielectric layer 150 is formed on the dielectric layer 120. For example, the dielectric layer 150 is formed on the dielectric liner 140. The dielectric layer 150, in one embodiment, includes a low-k dielectric material. Preferably, the dielectric layer 150 is formed of a low-k dielectric layer, such as SiCOH. The dielectric layer 150 may be formed by CVD. Any other suitable forming techniques or suitable low-k materials and thicknesses for the dielectric layer may also be useful.

In FIG. 3a, the dielectric layer 150 and the dielectric liner 140 in the first (or memory) region 110a are patterned to form trench openings 155. In one embodiment, the opening 155 in the first region 110a includes sufficient depth to accommodate a bottom electrode which will be coupled to the MTJ element of the memory cell. The trenches 155 may be formed by mask and etch techniques. For example, a patterned photoresist mask may be formed over the dielectric layer 150, serving as an etch mask. An etch, such as RIE, may be performed to pattern the dielectric layer 150 and dielectric liner 140 using the patterned resist etch mask. In one embodiment, the etch transfers the pattern of the mask to the dielectric layer 150, including the dielectric liner 140 to form the trenches 155. As shown, the etch stops when it reaches a top surface of the metal line 135 in the first region 110a. The metal line 135 in the first region, for example, serves as an etch stop for the trench opening 155. The shape of the trench opening, for example, may have a rectangular shape. Other shapes for the opening, such as circular, may also be useful.

The process continues by depositing a conductive layer over the first and second regions. For example, the conductive layer is conformally formed over a top surface of the dielectric layer 150 in the first and second regions and fills the trench openings 155 in the first region 110a. The conductive layer, for example, may include Ti, TiN, Ta or TaN and may be formed by physical vapor deposition (PVD). Other suitable conductive materials and deposition techniques may also be employed. A CMP process is performed to remove excess conductive material on top of the dielectric layer 150 and to provide a substantially planar top surface. As shown in FIG. 3a, the CMP process removes the conductive layer over the second region 110b and defines the bottom electrodes 162 in the first region 110a.

The process 300 continues to form MTJ stack of the MRAM cell and to form interconnects of a subsequent ILD level. Various layers 164-164d of the MTJ stack are formed on the second upper dielectric layer 150 as shown in FIG. 3a. For example, various layers of the MTJ stack of the MRAM cell are sequentially formed over the dielectric layer 150 in the first and second regions. The process forms various layers of the MTJ stack and a hard mask layer 168 over the dielectric layer 150 by PVD process. Other suitable techniques may also be used. The MTJ stack, for example, is shown to include four layers 164a-164d having materials the same as that described in FIGS. 1a-1b. It is understood that the MTJ stack may include other suitable number of layers and other suitable materials. The hard mask layer 168, for example, includes an oxide material.

The process continues to pattern the hard mask layer and layers of the MTJ stack. Patterning the layers may be achieved with mask and etch techniques. A soft mask 170, such as a photoresist layer, is formed on the hard mask layer. The soft mask is patterned to form a pattern which is used to define the MTJ layers. To form the pattern in the mask layer, it may be selectively exposed with an exposure source using a reticle (not shown). The pattern of the reticle is transferred to the resist layer 170 after exposure by a development process.

Figure 3B:
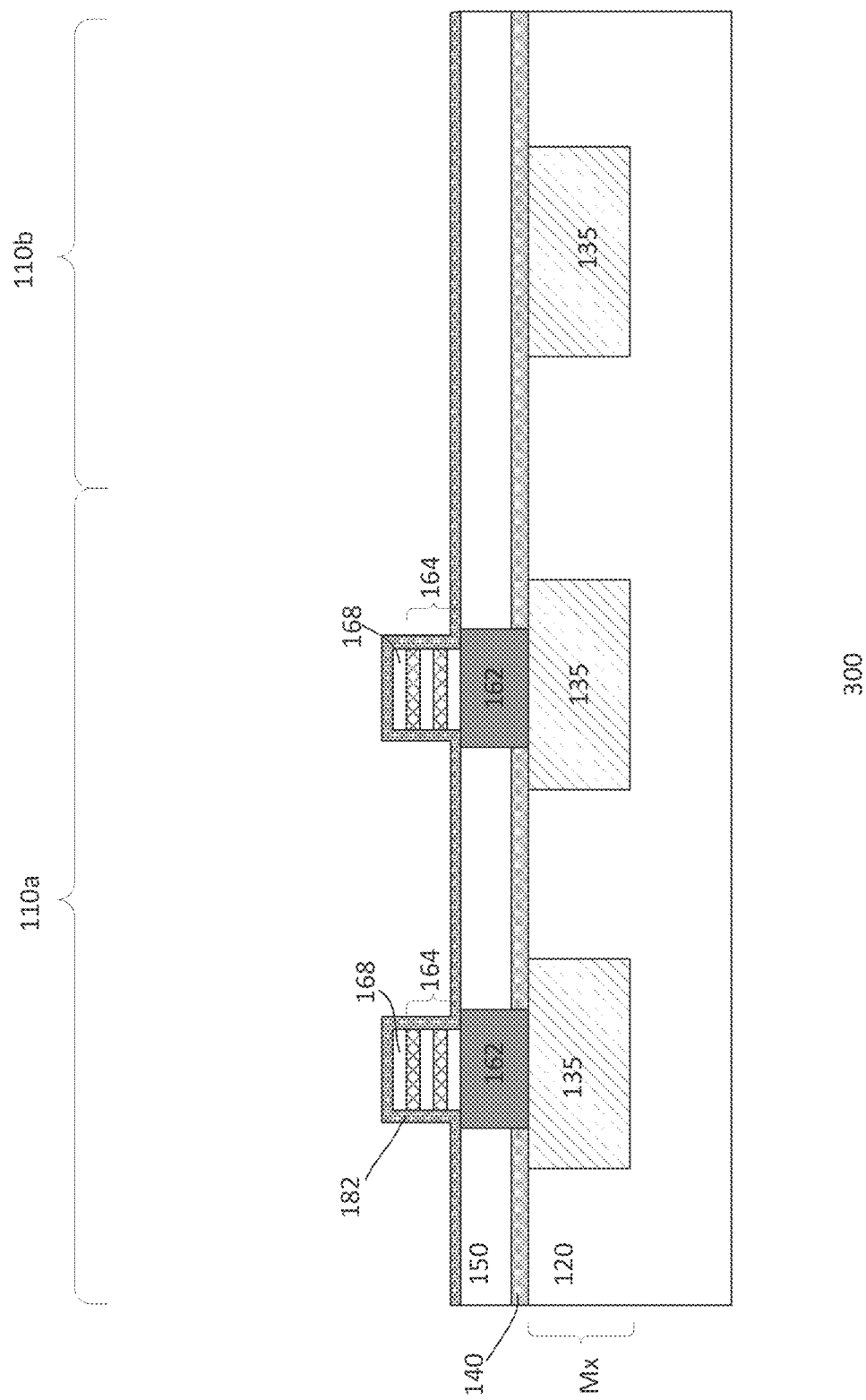

As shown in FIG. 3a, the patterned mask 170 is used to define the layers of the MTJ stack of the memory cell and hard mask 168 by removing portions of the layers of the MTJ stack and hard mask layer not protected by the patterned mask in the first and second regions. As shown in FIG. 3b, the hard mask and layers of the MTJ stack are patterned in such a way that the patterned hard mask 168 and layers 164a-164d of the MTJ stack 164 are aligned and properly coupled to the bottom electrode 162 in the first region 110a. Other suitable techniques for patterning the layers may also be useful. As shown in FIG. 3b, the hard mask layer and layers of the MTJ stack are completely removed from the second regions 110b. The patterned mask is removed using suitable techniques, such as ashing.

The process 300 continues by depositing a dielectric liner 182 over the first and second regions as shown in FIG. 3b. The dielectric liner 182 covers exposed surfaces of the patterned hard mask 168 and MTJ stack 164 in the first region 110a while covering top surface of the dielectric layer 150 in the first and second regions. The dielectric liner 182, for example, may be formed by CVD and serves as an etch stop layer or protective layer during subsequent processing. The dielectric liner may be a low k dielectric liner. For example, the dielectric liner may be silicon nitride. Other suitable types of dielectric materials for the dielectric liner and forming techniques may also be useful.

Referring to FIG. 3c, the process continues to process the dielectric liner 182. In one embodiment, a blanket etch process is performed to remove horizontal portions of the dielectric liner in the first and second regions, leaving vertical portions in the form of dielectric spacers 182 lining sidewalls of the patterned hard mask and layers of the MTJ stack in the first region as shown in FIG. 3c. As shown, the sidewalls of the patterned hard mask and layers of the MTJ stack are encapsulated with dielectric liners in the form of vertical dielectric spacers as shown in FIG. 3c.

Figure 3D:
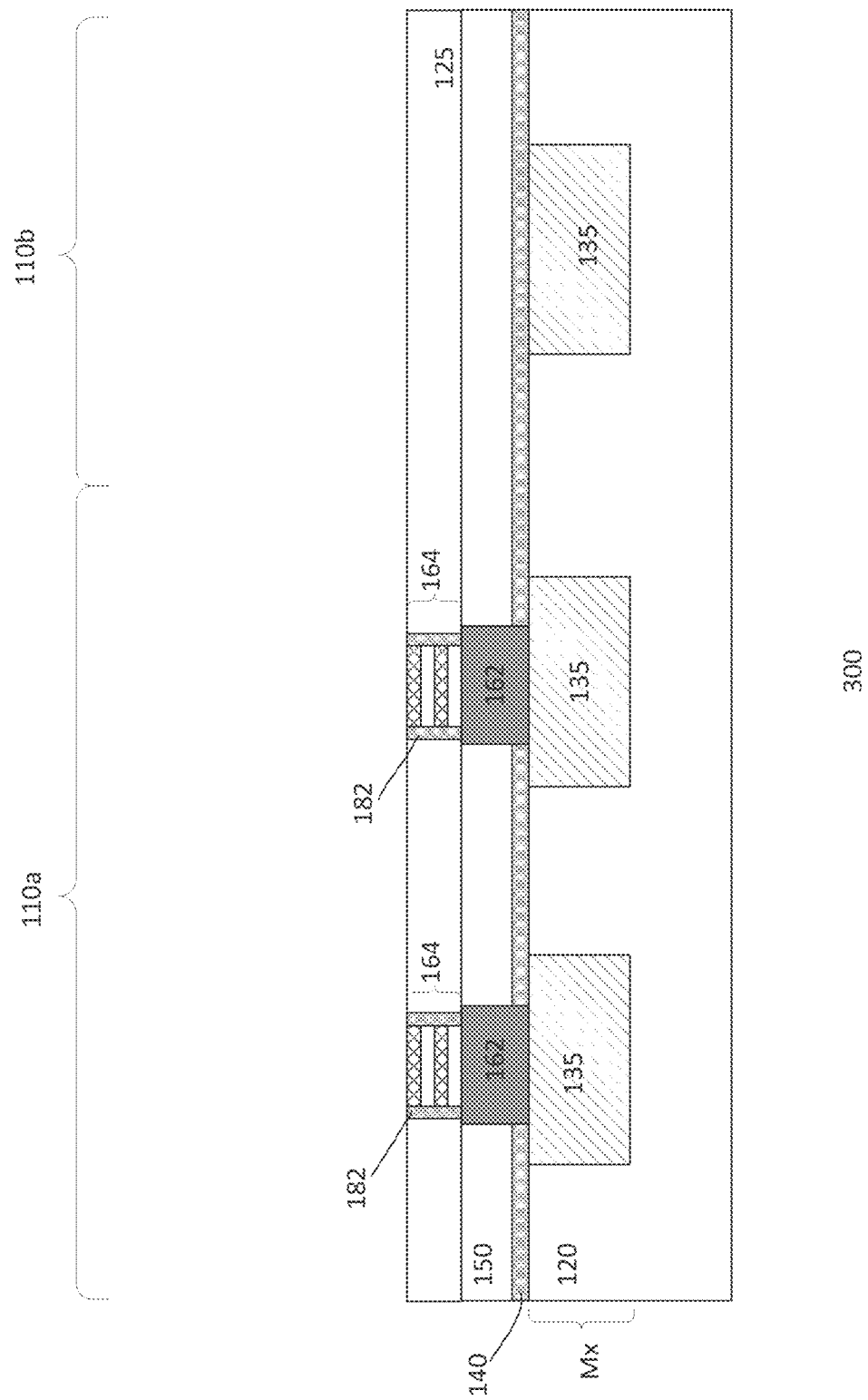

A third dielectric layer 125 is formed. The dielectric layer 125 is formed over the patterned hard mask and MTJ stack in the first region 110a and over the dielectric layer 150 in the second region 110b as shown in FIG. 3d. The dielectric layer 125, for example, includes a low-k dielectric material which is the same material as the dielectric layer 150. The dielectric layer 125 may be formed by CVD and the dielectric layer 125 includes a thickness sufficient to cover the patterned MTJ stack 164 and hard mask 168 in the first region. Other suitable dielectric materials and techniques may be used for forming the dielectric layer 125. A planarization process is performed to remove excess dielectric layer 125. The planarization process, for example, may be achieved by CMP. Other suitable techniques may also be useful. The planarization process produces a substantially planar top surface. As shown, the planarization process removes the hard mask 168 until a top surface of the MTJ stack 164 is exposed in the first region 110a as shown in FIG. 3d. The planarized dielectric layer 125, for example, surrounds and covers the sides of the MTJ stack in the first region.

Figure 3E:
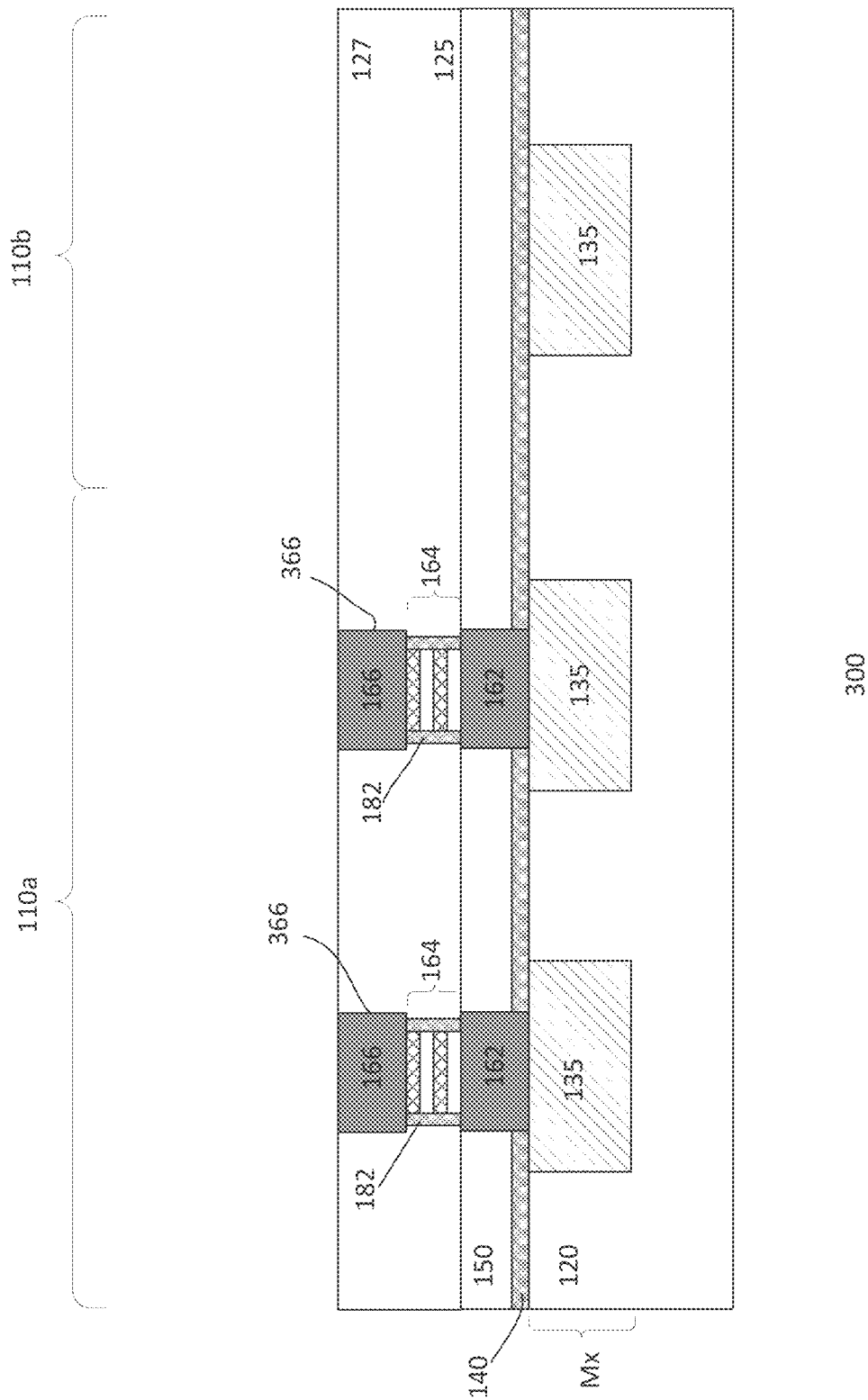

The process 300, in one embodiment, continues to form a fourth dielectric layer 127 as shown in FIG. 3e. The dielectric layer 127 includes the same material and is formed by the same technique as that described for the dielectric layer 125 in FIG. 3d. Alternatively, the CMP can stop in the dielectric layer 125 without exposing the top surface of the MTJ stack 164. In such case, the remaining oxide on top of MTJ is then layer 127.

In one embodiment, the dielectric layer 127 is patterned to form trench openings 366 in the first region 110a as shown in FIG. 3e. The trench opening 366, for example, includes a damascene opening which exposes the top surface of the MTJ stack 164. The openings may be formed by mask and etch techniques. For example, a patterned photoresist mask (not shown) may be formed over the dielectric layer 127, serving as an etch mask. An etch, such as RIE, may be performed to pattern the dielectric layer 127 using the patterned resist etch mask and the etch stops when it reaches a top surface of the MTJ stack 164. Thus, the top surface of the MTJ stack may serve as an etch stop layer. The trench openings, for example, should be sufficiently wide and deep to accommodate a top electrode later.

The process 300 continues by forming a top electrode layer. The top electrode layer, in one embodiment, includes the same material and is formed by the same technique used for forming the bottom electrode 162. As shown in FIG. 3e, the top electrode layer is deposited over the first and second regions and fills the trench openings 366 in the first region 110a. A planarization process is performed to remove excess top electrode layer. The planarization process, for example, may be achieved by CMP. Other suitable techniques may also be useful. The planarization process produces a substantially planar top surface in the first region and completely removes the top electrode layer from the second region. As shown, the planarization process is performed until it reaches a top surface of the dielectric layer 127 as shown in FIG. 3e. As shown, the planarization process defines the top electrode 166 having a top surface substantially coplanar with top surface of the dielectric layer 127 in the first region.

Figure 3F:
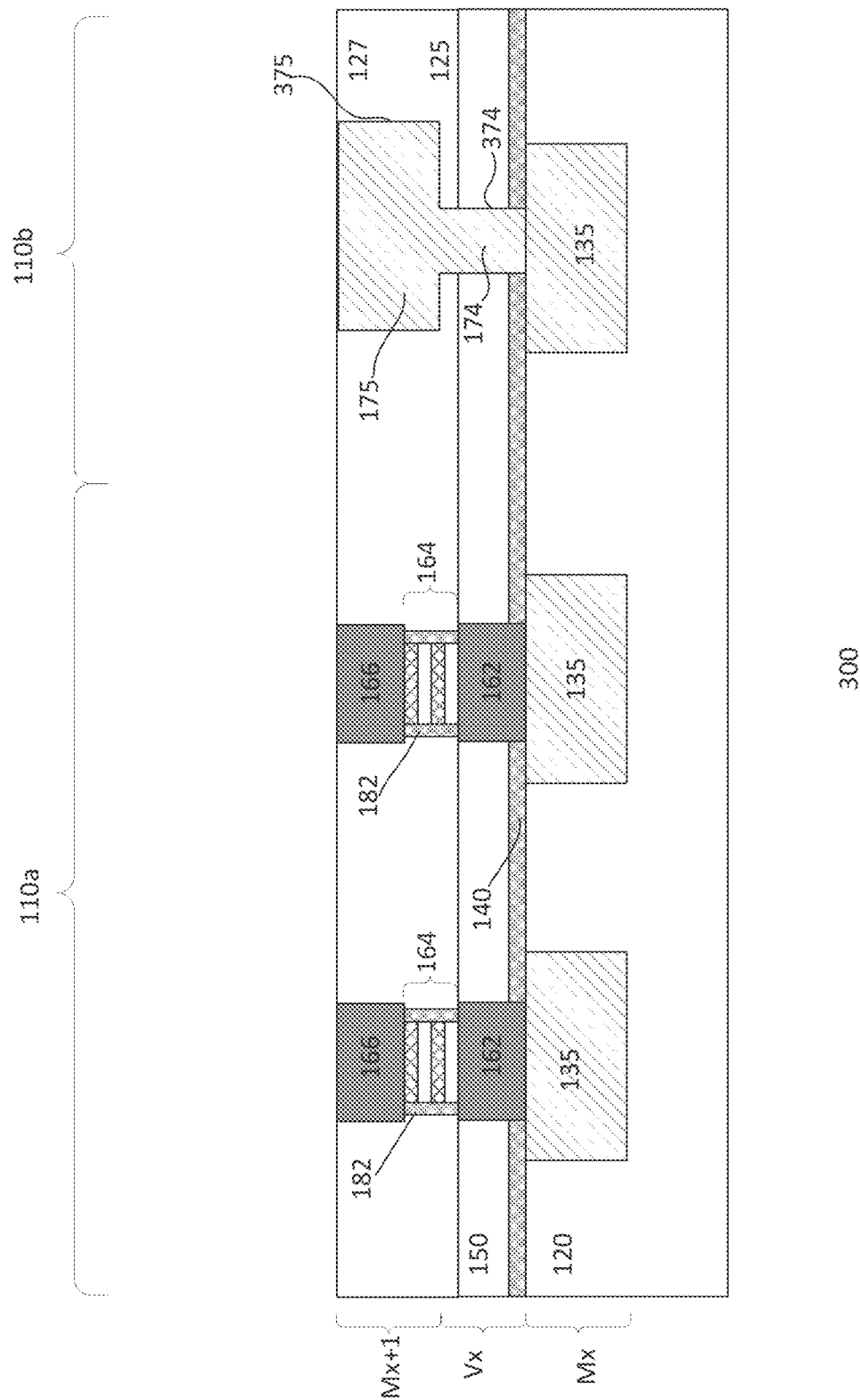

In one embodiment, the process 300 continues to form dual damascene opening having a trench and a via opening in the dielectric layers 125 and 127 in the second region 110b. The dual damascene opening may be formed by via first or via last process. Referring to FIG. 3f, the dielectric layers are patterned to form via opening 374 in the second region. The via opening 374 may be formed by mask and etch techniques. For example, a mask (not shown), such as photoresist, may be used to serve as an etch mask to pattern the dielectric layers 125 and 127 to form the via opening 374 in the second region. A first etch, for example, which is highly selective to the material of the dielectric layers 125 and 127 is employed to remove exposed portions of the dielectric layers to form the via opening. As shown, the first etch forms the via opening 374 in the second region and stops when it reaches the dielectric liner 140. Since the first etch is highly selective to the material of the dielectric layers, the first etch, for example, stops when it reaches top surface of the dielectric liner 140.

Referring to FIG. 3f, the dielectric layer 127 is patterned to form trench opening 375 in the second region 110b. The trench may be formed by mask and etch techniques. For example, a mask (not shown), such as photoresist, may be used to serve as an etch mask to pattern the dielectric layer 127 to form the trench. To form the trench, a second etch may be performed. The second etch, for example, may be a two-step etch process which can be performed in-situ. The first etch of the two-step etch process, for example, is highly selective to the material of the dielectric layer 127 and stops on top of the dielectric liner 140 while the second etch of the two-step etch process, for example, is highly selective to material of the dielectric liner and removes exposed portions of the dielectric liner 140. Thus, dual damascene opening is formed in the second region as shown in FIG. 3f while the first region is protected by the mask (not shown). As shown, the trench 375 in the second region is in communication with the via opening 374 which is in communication with the metal line 135. The dimensions of this trench 375 and its underlying via opening 374, in one embodiment, are defined at the minimum line resolution of the lithography and etch capability for a technology process node, which may be referred to as 1× design rule. Thus, the dielectric layers 150, 125 and 127, for example, are sufficiently thick to accommodate metal lines and via contacts defined by 1× design rule of logic processing. The dielectric layers 150, 125 and 127 may be referred to as a second ILD level having tight pitch and its metal level may be referred to as Mx+1 while its via level may be referred to as Vx.

A conductive layer is formed. The conductive layer covers the dielectric layer 125 as well as filling the trench 375 and via opening 374. For example, the conductive layer fills the dual damascene opening in the second region. The conductive layer should be sufficiently thick to fill the trench and via opening. In one embodiment, the conductive layer is a Cu layer. Other suitable types of conductive layers may also be useful. The conductive layer may be formed by, for example, ECP. Other suitable techniques for forming the conductive layer may also be useful.

Excess conductive material is removed by CMP, forming metal line 175 and via contact 174 in the second region as shown in FIG. 3f. As shown, the top surface of the metal line is substantially planar with the top surface of the dielectric layer 127. This completes formation of metal lines 175 in metal level Mx+1 and via contact 174 in via level Vx.

In one embodiment, the process 300 continues to form interconnects of a subsequent or the next higher ILD level. For example, the process continues to form metal lines in metal level Mx+2 and via contacts in via level Vx+1. To form the interconnects, a dielectric liner 142 and a fifth dielectric layer 129 may be formed over the dielectric layer 127, covering the top electrodes 166 in the first region and the metal line 175 of metal level Mx+1 in the second region. The dielectric liner 142 and the dielectric layer 129 may be formed using the same material and techniques used for forming the dielectric liner 140 and dielectric layer 127.

Figure 3G:
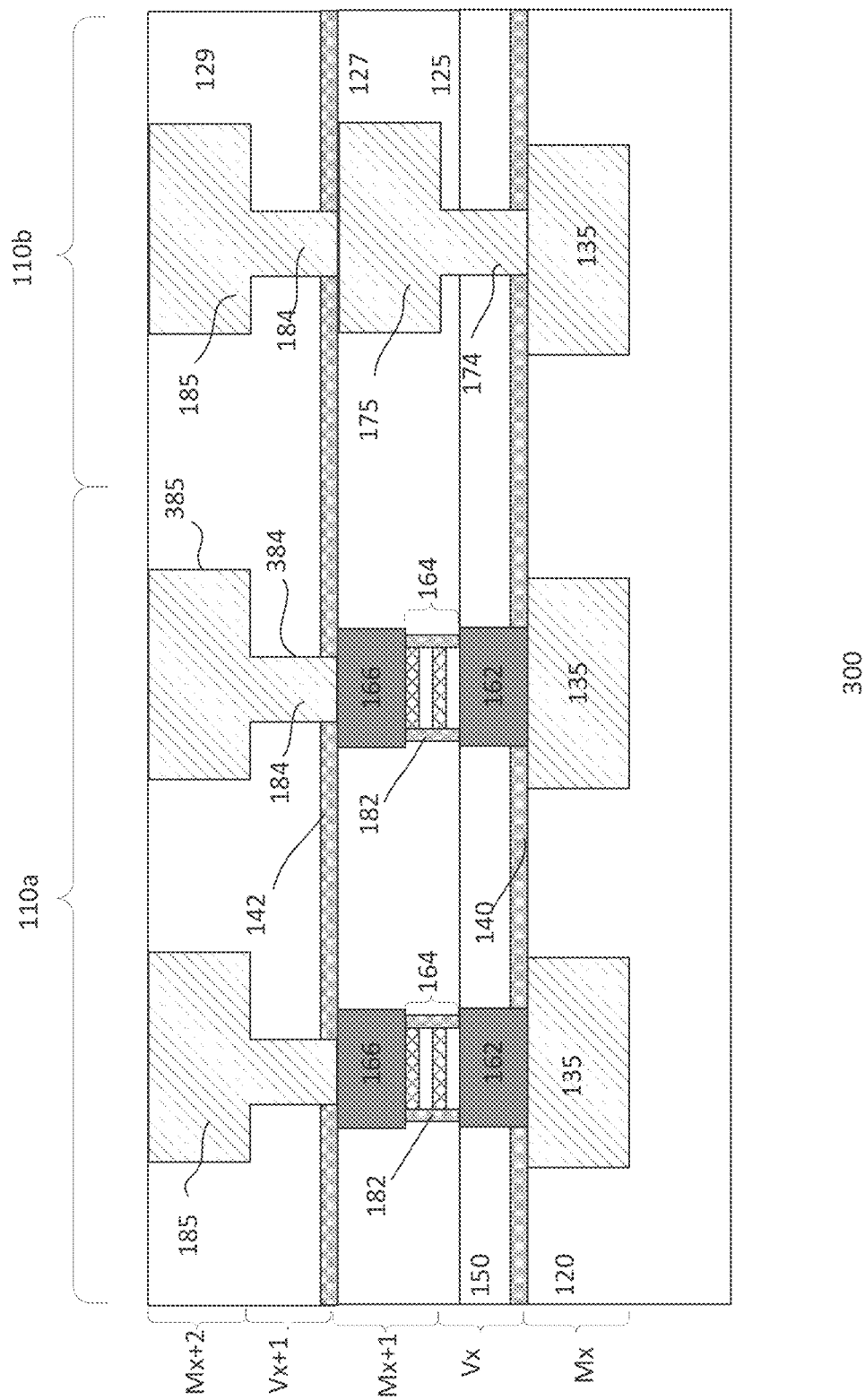

In one embodiment, the process 300 continues to form dual damascene openings in the dielectric layer 129 in the first and second regions. A dual damascene opening includes a trench and a via opening. The dual damascene openings may be formed by via first or via last process. Referring to FIG. 3g, the dielectric layer 129 are patterned to form via openings 384 in the first and second regions simultaneously. The via openings 384 may be formed by mask and etch techniques. For example, a mask (not shown), such as photoresist, may be used to serve as an etch mask to pattern the dielectric layer 129 to form the via openings in the first and second regions. A first etch, for example, which is highly selective to the material of the dielectric layer 129 is employed to remove exposed portions of the dielectric layer to form the via openings. In one embodiment, the first etch simultaneously removes the exposed portion of the dielectric layer 129 to forms via openings 384 in the first and second regions. As shown, the first etch forms the via openings 384 in the first and second region and stops when it reaches the dielectric liner 142. Since the first etch is highly selective to the material of the dielectric layer, the first etch, for example, stops when it reaches top surface of the dielectric liner 142.

The process 300 continues to pattern the dielectric layer 129 to form trenches 385 in the first and second regions simultaneously. The trenches may be formed by mask and etch techniques. For example, a mask (not shown), such as photoresist, may be used to serve as an etch mask to pattern the dielectric layer 129 to form the trenches. To form the trenches, a second etch may be performed. The second etch, for example, may be a two-step etch process which can be performed in-situ. The first etch of the two-step etch process, for example, is highly selective to the material of the dielectric layer 129 and stops on top of the dielectric liner 142 while the second etch of the two-step etch process, for example, is highly selective to material of the dielectric liner 142 and removes exposed portions of the dielectric liner 142. Thus, dual damascene openings are formed in the first and second regions as shown in FIG. 3g. As shown, the trench 385 in the first region is in communication with the via opening 384 which is in communication with the top electrode 166 over the MTJ stack while the trench 385 in the second region is in communication with the via opening 384 which is in communication with the metal line 175 of metal level Mx+1. The dimensions of the trench 385 and its underlying via opening 384, in one embodiment, are defined at the minimum line resolution of the lithography and etch capability for a technology process node, which may be referred to as 1× design rule. Thus, the dielectric layer 129, for example, is sufficiently thick to accommodate metal lines and via contacts defined by 1× design rule of logic processing. The dielectric layer 129 may be referred to as a third ILD level and its metal level may be referred to as Mx+2 while its via level may be referred to as Vx+1. In another embodiment, the trench 385 and via opening 384 may be defined based on design rule different than underlying ILD level. As discussed, the design rule may be constrained by the design rule or pitch of the MTJ stack. For example, design rule is the same as the MTJ stack.

A conductive layer is formed. The conductive layer covers the dielectric layer 129 as well as filling the trenches 385 and via openings 384. For example, the conductive layer fills the dual damascene openings in the first and second regions. The conductive layer should be sufficiently thick to fill the trenches and via openings. In one embodiment, the conductive layer is a Cu layer. Other suitable types of conductive layers may also be useful. The conductive layer may be formed by, for example, ECP. Other suitable techniques for forming the conductive layer may also be useful.

Excess conductive material is removed by CMP, forming metal lines 185 and top via contacts 184 in the first and second regions as shown in FIG. 3g. As shown, the top surface of the metal lines is substantially planar with the top surface of the dielectric layer 129.

The process continues to complete formation of the IC. The process, for example, may continue to form additional ILD levels with interconnects in these higher ILD levels, passivation layer and pad interconnects or bonding pads. Further processing can include final passivation, dicing, assembly and packaging. Other processes are also useful.

The process 300 as described, for example, form storage elements in between metal level Mx and metal level Mx+2. More particularly, the storage element of the memory cell is formed in between metal level Mx and via level Vx+1. The metal lines in Mx+2 and via contacts in Vx+1 provides electrical connection to the storage element in the first region. Even if there is an overetch due to process limitation during formation of metal lines in Mx+2, the metal lines in Mx+2 would not cause electrical short to the top electrode due to sufficient gap between the Mx+2 and top electrode. Thus, in such configuration, the storage element having a total height greater than the via height Vx can be safely inserted in ILD level having tight pitch (e.g., defined at 1× design rule) without any reliability concern.

Figure 4A:
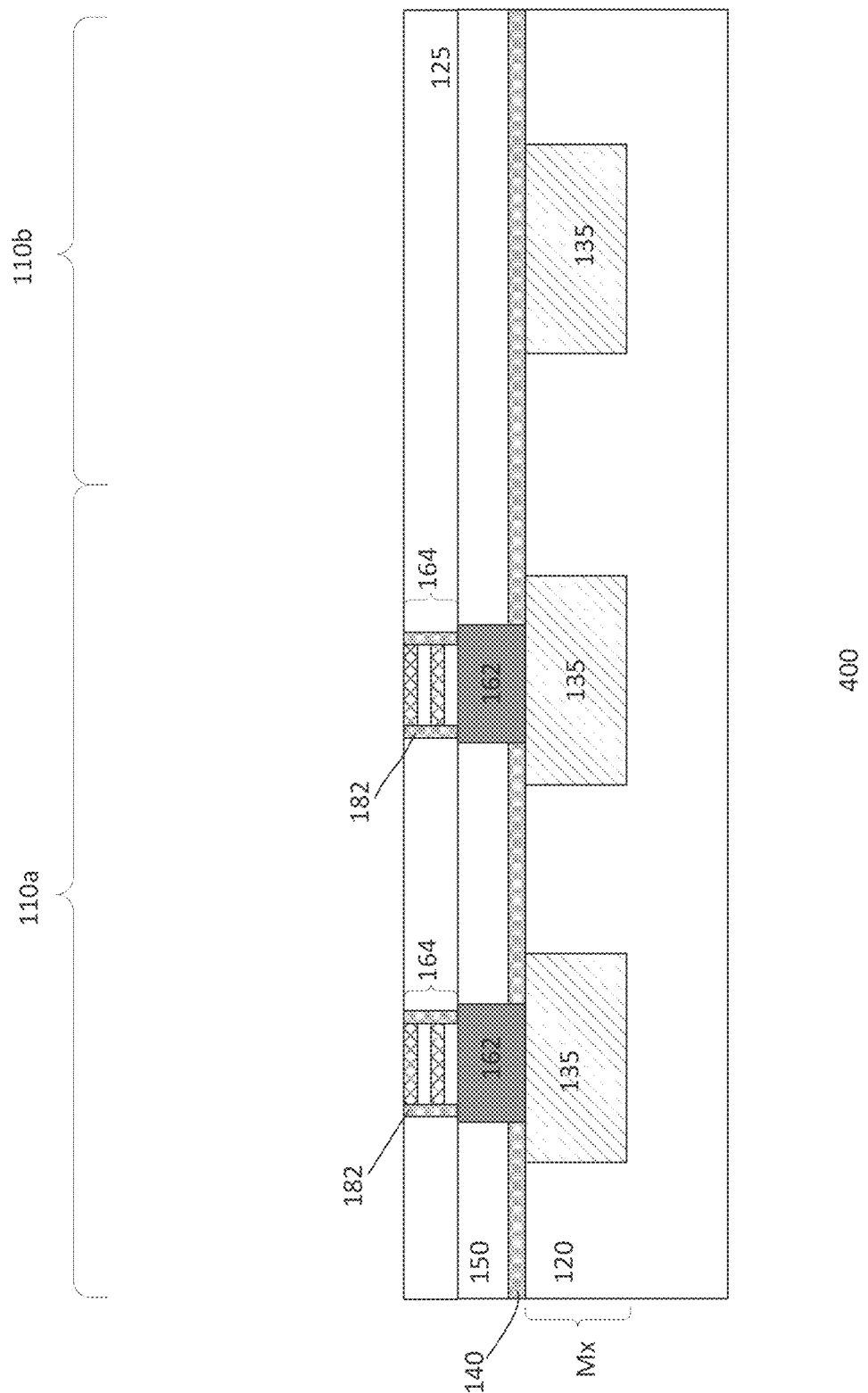
FIGS. 4a-4f show cross-sectional views of another embodiment of a process for forming a device.
Figure 4B:
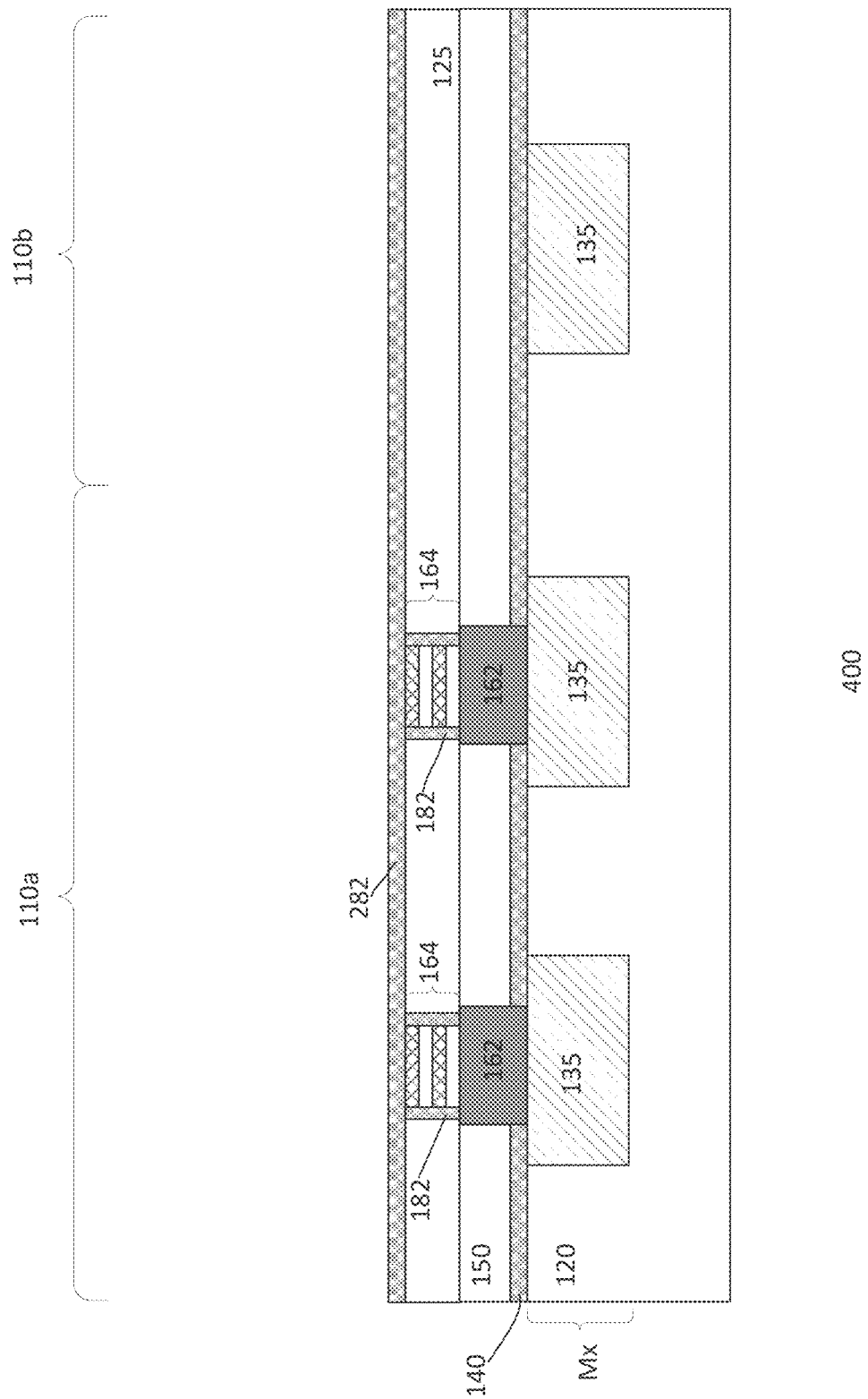

FIGS. 4a-4f show cross-sectional views of another embodiment of a process 400 for forming a device. The device formed by process 400 is the same or similar to the device 200 as described in FIGS. 2a-2b and the process 400 may contain similar steps as that described in FIGS. 3a-3g. In the interest of brevity, common elements may not be described or described in detail. As shown in FIG. 4a, the partially processed substrate is at the stage as described in FIG. 3d. For example, a third dielectric layer 125 is formed over the patterned hard mask and MTJ stack in the first region and over the dielectric layer 150 in the second region. A planarization process is performed and removes the hard mask 168 until a top surface of the MTJ stack 164 is exposed in the first region 110a as shown in FIG. 4a.

In one embodiment, the process 400 continues to form a dielectric liner 282 over the dielectric layer 125, covering the exposed top surfaces of the MTJ stack and dielectric spacers 182. The dielectric liner 282 may include the same material and may be formed by the same technique used for dielectric liner 182 as described in FIG. 3b and may include sufficient thickness to serve as an etch stop layer and protective layer during subsequent processing.

Figure 4C:
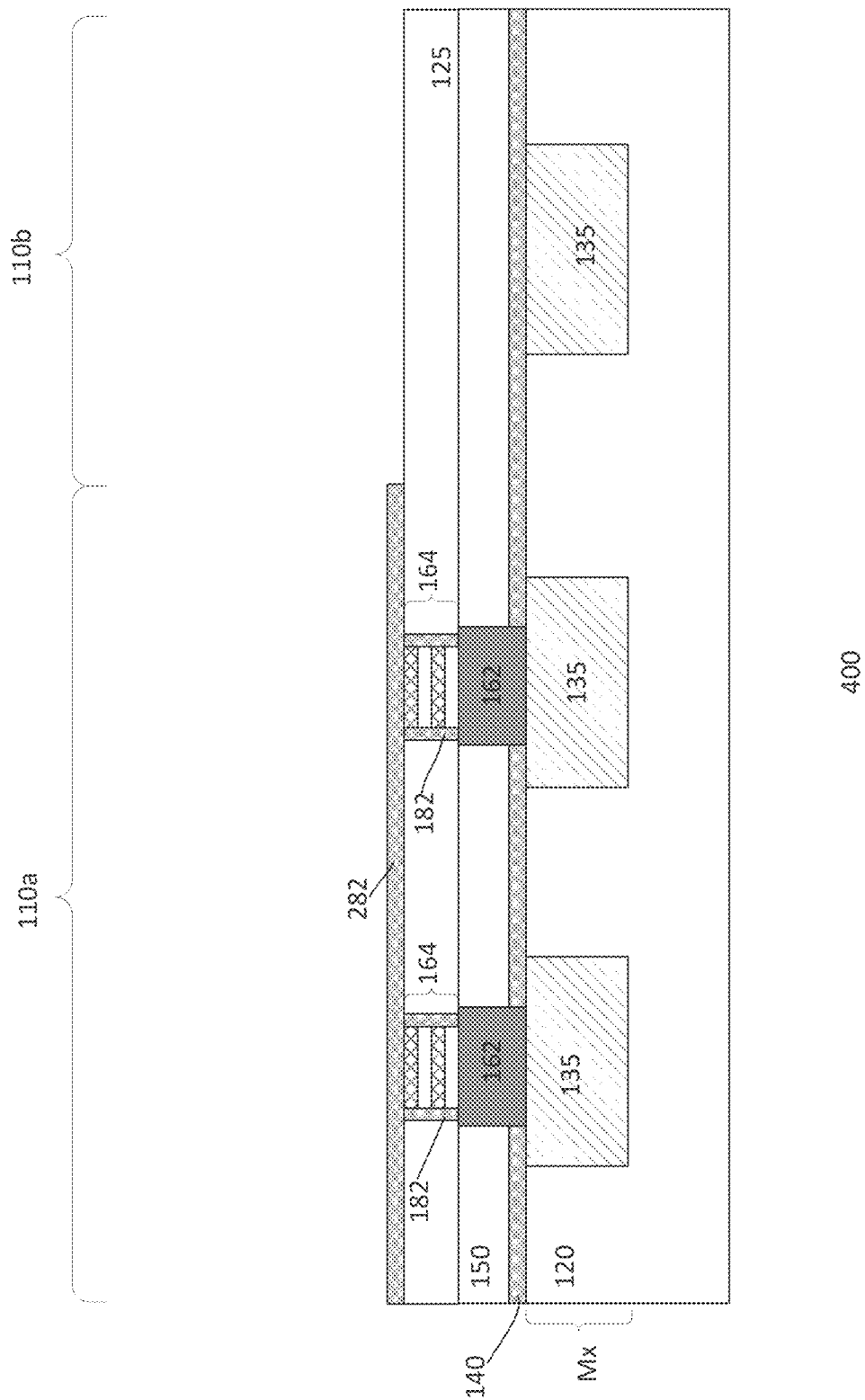

The process 400 continues to pattern the dielectric liner 282. Patterning the dielectric liner 282 may be achieved with mask and etch techniques. A soft mask (not shown), such as a photoresist layer, is formed on the dielectric liner 282. The soft mask is patterned to form a pattern which exposes portion of the dielectric liner 282 in the second region 110b. As shown in FIG. 4c, the patterned mask (not shown) is used to define the dielectric liner 282 by removing exposed portion of the dielectric liner 282 not protected by the patterned mask in the second region. Other suitable techniques for patterning the dielectric liner may also be useful. Referring to FIG. 4c, the dielectric liner 282 is completely removed from the second region 110b. The patterned mask is removed using suitable techniques, such as ashing. As shown, the patterned dielectric liner 282 remains over the dielectric layer 125 and covers the top electrode 166 in the first region 110a.

Figure 4D:
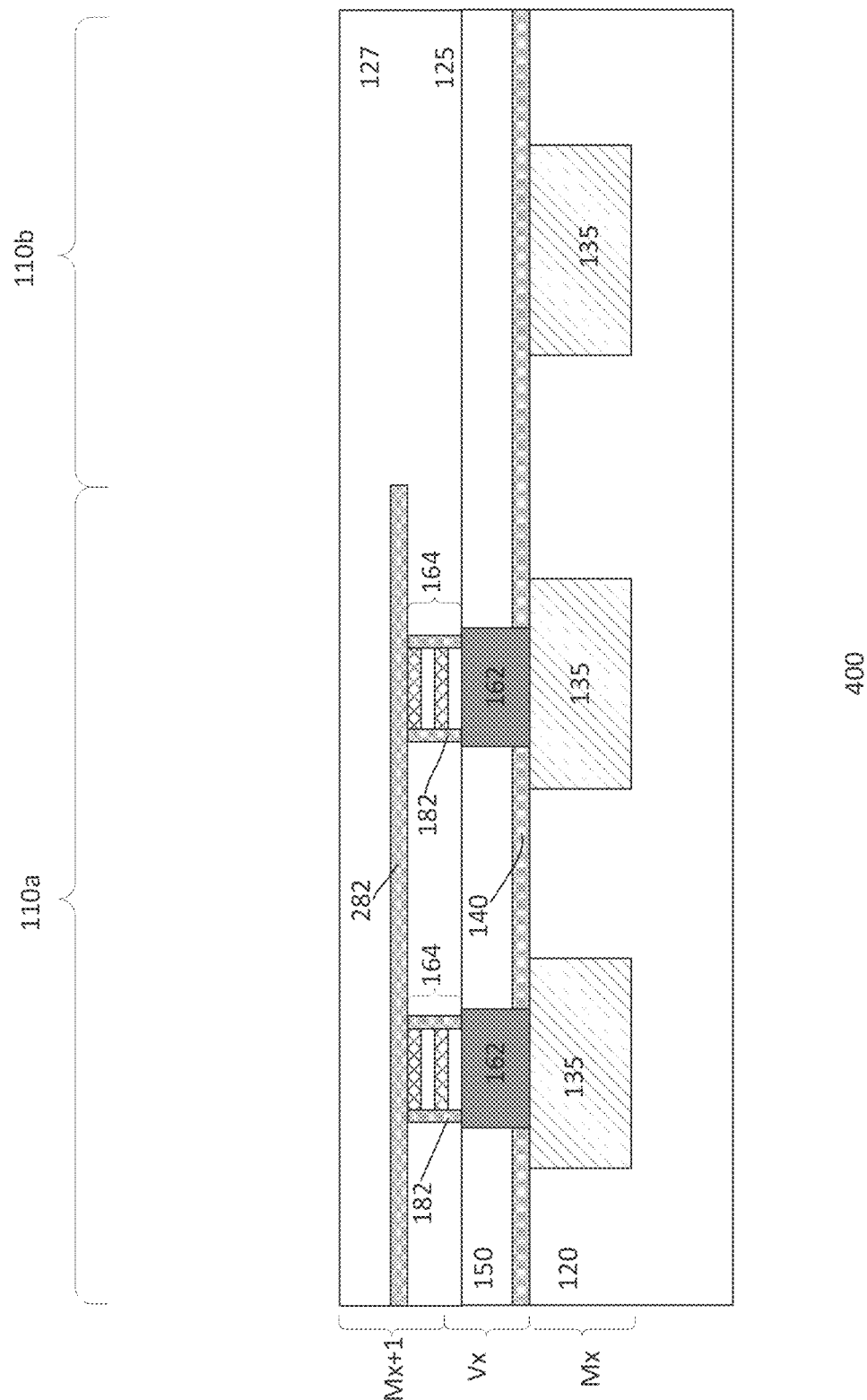

The process 400 continues to form a fourth dielectric layer 127 as shown in FIG. 4d. Materials and techniques for forming the dielectric layer 127 are the same as that described in FIG. 3e. The dielectric layer 127, for example, includes sufficient thickness to cover the dielectric liner 282 in the first region and the dielectric layer 125 in the second region as shown in FIG. 4d.

After forming the dielectric layer 127, the process continues to form dual damascene openings having a trench 375 and a via opening 374 in the second region 110b and damascene openings having trenches 375 in the first region 110a. The dual damascene opening may be formed by via first or via last process. For example, a mask (not shown), such as photoresist, may be used to serve as an etch mask to pattern the dielectric layers 125 and 127 to form the via opening 374 in the second region. A first etch, for example, which is highly selective to the material of the dielectric layers 125 and 127 is employed to remove exposed portions of the dielectric layers to form the via opening. As shown, the first etch forms the via opening 374 in the second region and stops when it reaches the dielectric liner 140. Since the first etch is highly selective to the material of the dielectric layers, the first etch, for example, stops when it reaches top surface of the dielectric liner 140.

A second etch process is then performed to define the trenches 375 and to remove exposed portions of the dielectric liner 282 and 140. The second etch process, for example, may include a two-step etch process to form trenches 375 in the first and second regions simultaneously. The trenches may be formed by suitable mask and etch techniques. The first etch of the two-step etch process, for example, may employ an etch which is highly selective to the material of the dielectric layers 127 and 125 while the second etch of the two-step etch process is highly selective to the material of the dielectric liners 282 and 140. As shown, the first etch of the two-step etch process forms the trenches in the first region and stops when it reaches the dielectric liner 282 while the first etch may further remove dielectric materials to form the trench 375 in the second region. In this case, the dielectric liner 282 protects the top electrode 166 in the first region from being consumed while the first etch continues to form the trench in the second region. The second etch of the two-step etch process removes exposed portions of the dielectric liners 282 and 140 and stops when it reaches top surface of the MTJ stack. Thus, the top surface of the MTJ stack serves as an etch stop layer. The trenches 375 in the first region, for example, includes a depth or height which is shallower than a depth of the trench 375 in the second region. Other suitable depth dimensions may also be useful. As shown, the etch forms the trenches 375 in the first and second regions simultaneously. Thus, the trenches in the first and second regions, for example, are formed by the same etch process.

Figure 4E:
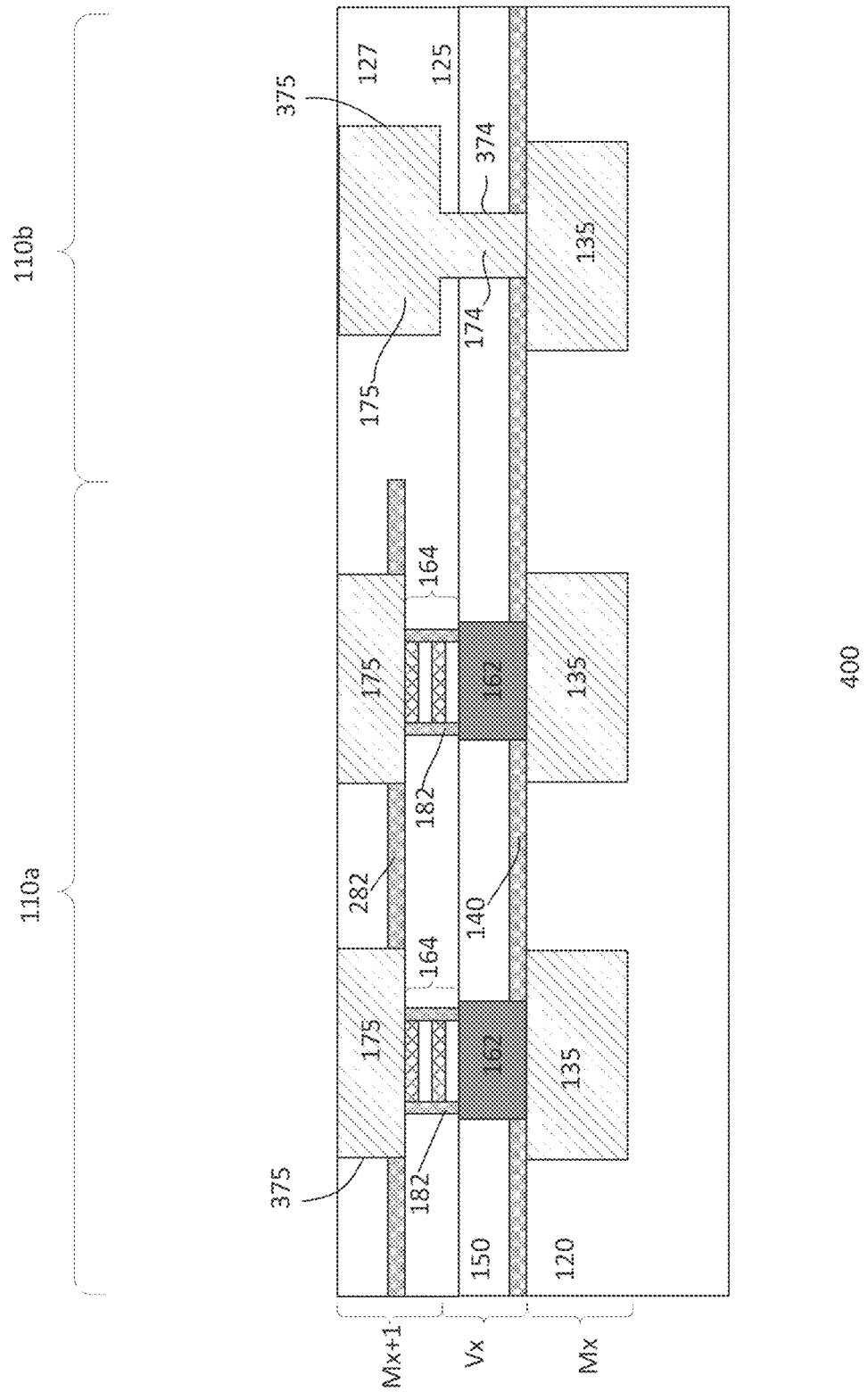

Referring to FIG. 4e, the trenches 375 in the first region are in communication with the MTJ stacks 164 while the trench in the second region is in communication with the via opening 374 which is in communication with the metal line 135. The dimensions of the trenches 375 and underlying via opening 374, in one embodiment, are defined at the minimum line resolution of the lithography and etch capability for a technology process node, which may be referred to as 1× design rule. Thus, the dielectric layers 150, 125 and 127, for example, are sufficiently thick to accommodate metal lines and via contacts defined by 1× design rule of logic processing. The dielectric layers 150, 125 and 127 may be referred to as a second ILD level and its metal level may be referred to as metal level Mx+1 while its via level may be referred to as Vx.

A conductive layer is provided to fill the trenches 375 and via opening 374. Excess conductive material is removed by CMP, forming metal lines 175 in the first region as well as metal lines 175 and via contact 174 in the second region as shown in FIG. 4e. Techniques to provide the conductive material and to remove excess conductive material to form metal lines and via contact are the same as that described in FIG. 3f. As shown in FIG. 4e, the top surface of the metal lines is substantially planar with the top surface of the dielectric layer 127. This completes formation of metal lines in metal level Mx+1 and via contacts in via level Vx. The metal lines 175 in the first region, in one embodiment, provide electrical connection to the MTJ stack.

Figure 4F:
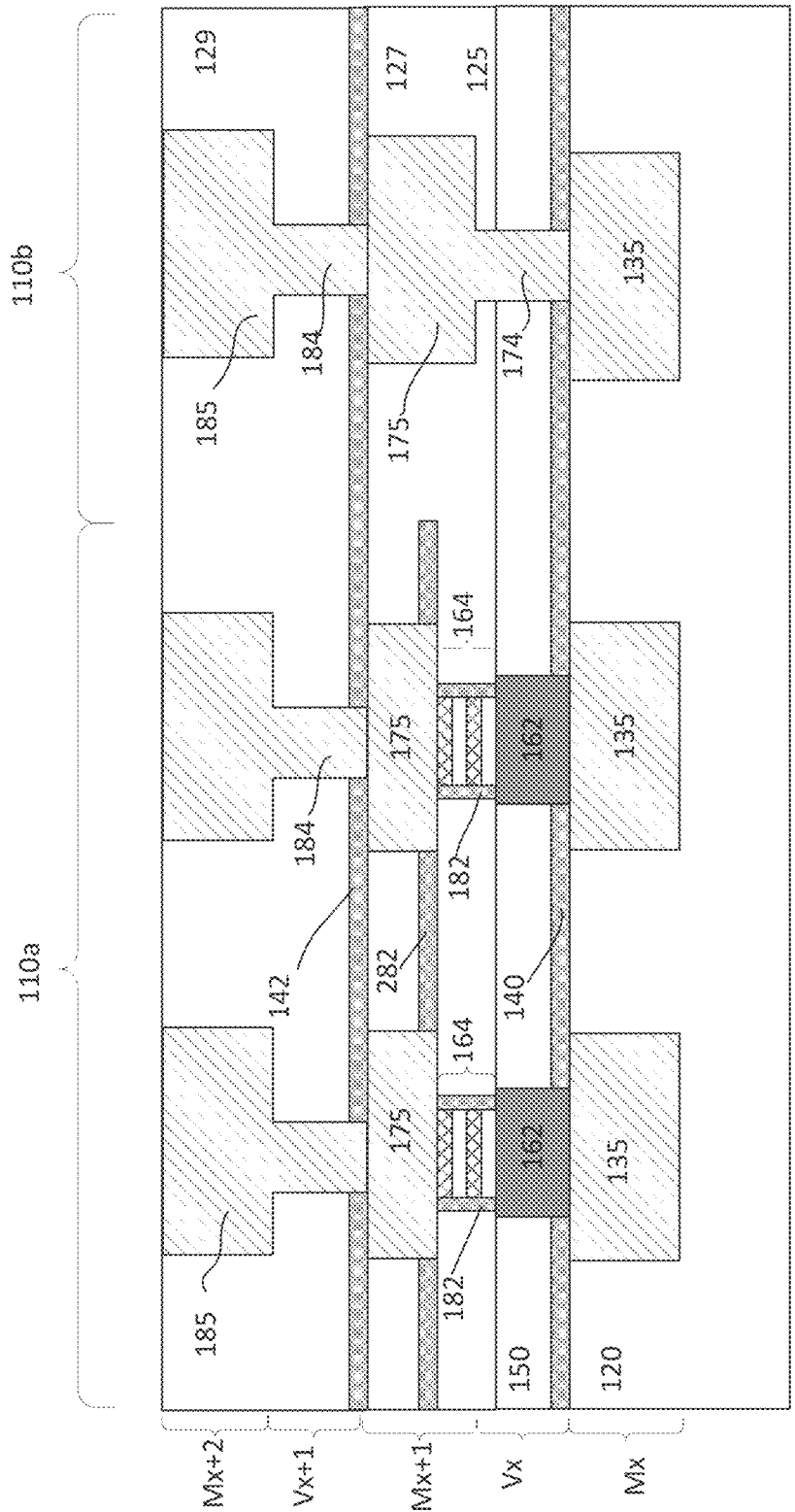

In one embodiment, the process 400 continues to form interconnects of a subsequent or the next higher ILD level. For example, the process continues to form dielectric liner 142, fifth dielectric layer 129, metal lines 185 in metal level Mx+2 and via contacts in via level Vx+1 as shown in FIG. 4f. Materials and techniques for forming the dielectric liner 142, dielectric layer 129 and dual damascene interconnects having metal lines 185 in metal level Mx+2 and via contacts in via level Vx+1 are the same as that described in FIG. 3g. In one embodiment, the metal lines 185 in Mx+2 and via contacts 184 in Vx+1 in the first region 110a are coupled to the metal lines 175 over the MTJ stacks. As for the metal lines 185 in Mx+2 and via contact 184 in Vx+1 in the second region 110b, they are coupled to the metal line 175 in Mx+1 and via contact 174 in Vx of the second region.

The process continues to complete formation of the IC. The process, for example, may continue to form additional higher ILD levels with interconnects, passivation layer and pad interconnects or bonding pads. Further processing can include final passivation, dicing, assembly and packaging. Other processes are also useful.

The process 400 as described, for example, form storage elements in between metal level Mx and via level Vx+1. The metal line in Mx+1 provides electrical connection to the storage element in the first region 110a. Even if there is a process limitation during formation of metal lines in Mx+1, the metal lines in Mx+1 would not cause electrical short to the MTJ stack due to the presence of the dielectric liner 282 which serves a an etch stop layer. Thus, in such configuration, the storage element having a total height greater than the via height Vx can be safely inserted in ILD level having tight pitch (e.g., defined at 1× design rule) without any reliability concern.

As described, the device includes one memory cell. However, it is understood that a device may include numerous memory cells integrated into the same IC. Further, although the two-terminal device element as described in the present disclosure refers to the MTJ storage element of a MRAM cell, it is understood that other suitable two-terminal device elements may also be integrated with the shallow interconnects having tight pitch (e.g., defined with 1× design rule) of logic component using the techniques and processes as described herein. In addition, although the two-terminal device element as described is disposed in specified ILD level of the back end dielectric layer, other configurations may also be useful. For example, the two-terminal device element may be disposed in other suitable ILD level with tight pitch having shallow interconnect structures.

The embodiments as described in the present disclosure result in various advantages. The process as described is highly compatible with logic processing or technology. For example, the two-terminal device element such as the MTJ element is formed in between metal level Mx and via level Vx+1 on the same substrate using logic processing without compromising the reliabilities of the memory cell and other components in the logic region on the same substrate. Moreover, the process as described is useful for integrating MTJ element of an MRAM cell with logic components in BEOL layers with minimal number of masks. For example, in one embodiment, the mask used for defining the trench opening for logic component in the logic region may also be used for defining trench opening in the memory region. In such case, the metal line Mx+1 which provides electrical connection to the MTJ element is formed simultaneously with the metal line Mx+1 of the logic region of the same ILD level. Furthermore, the height of the bottom and top electrodes of the memory cell formed in the memory region can be made flexible and compatible with any suitable desired or required total metal line and via height of the interconnect in the logic region of the same ILD level. The process as described avoids investment of new tools and reduces the number of masks involved for integrating two-terminal device elements with logic components. The embodiments as described in this disclosure are flexible as the MTJ element of the MRAM cell may be disposed in suitable ILD levels with tight pitch as the total height of the two-terminal device element can be adjusted or tuned to be the same or less than the total height of the metal line and via contact in the logic region of the same ILD level. The processes as described in this disclosure allows reliable insertion of the MTJ stack layers and top/bottom electrode in between layers having tight pitch with via height of the logic component shallower than the total height of the MTJ stack layers and top/bottom electrode.

The present disclosure may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A method of forming a device comprising:
providing a substrate defined with at least first and second regions;
providing a plurality of interlevel dielectric (ILD) levels having tight pitch over the first and second regions of the substrate, comprising
wherein the plurality of ILD levels comprises
an ILD level of which a two-terminal element disposed thereon corresponds to a first ILD level and its metal level corresponds to Mx,
an immediate ILD level overlying the metal level Mx corresponds to a second ILD level includes a via level Vx and a metal level Mx+1, and
the next overlying ILD level corresponds to a third ILD level includes a via level Vx+1 and a metal level Mx+2,
forming a first dielectric layer and forming a second upper dielectric layer over the first and second regions covering the first dielectric layer, and
patterning the second dielectric layer to form a trench opening in the first region;
forming a two-terminal device element in between the metal level Mx and the via level Vx+1 in the first region, wherein the two-terminal device element comprises a device layer coupled in between the first and second terminals, wherein the first terminal is in direct contact with a metal line in the metal level Mx of the first region and the second terminal is formed on a top surface of the device layer, and wherein the device layer is a MTJ stack of a MRAM cell, and wherein a total height of the MTJ stack with top and bottom electrodes is greater than a height of a via contact in the via level Vx and is shallower or same as a total height of a metal line in the metal level Mx+1 and the via contact in the via level Vx;

forming a dual damascene interconnect over the second region in the second ILD level, wherein the dual damascene interconnect comprises a metal line in the metal level Mx+1 and a via contact in the via level Vx in the second region; and forming dual damascene interconnects in the third ILD level over the first and second regions, wherein a dual damascene interconnect includes a metal line in the metal level Mx+2 and a via contact in the via level Vx+1, and wherein the dual damascene interconnect in the first region is coupled to the two-terminal device element and the dual damascene interconnect in the second region is formed over and is coupled to the dual damascene interconnect in the second ILD level.

2. The method of claim 1 wherein at least the first and second ILD levels are defined at 1× design rule.

3. The method of claim 1 wherein the first region is a memory region for accommodating at least one memory cell, the second region is a logic region for accommodating at least one logic component, and wherein the two-terminal device element is a storage element of the MRAM cell, the first terminal is the bottom electrode, the second terminal is the top electrode.

4. A method of forming a device comprising:

providing a substrate defined with at least first and second regions, wherein the first region is a memory region for accommodating at least one memory cell, the second region is a logic region for accommodating at least one logic component;

providing a plurality of interlevel dielectric (ILD) levels having tight pitch over the first and second regions of the substrate, comprising
  wherein the plurality of ILD levels comprises
    an ILD level of which a two-terminal element disposed thereon corresponds to a first ILD level and its metal level corresponds to Mx,
    an immediate ILD level overlying the metal level Mx corresponds to a second ILD level includes via level Vx and metal level Mx+1, and
    the next overlying ILD level corresponds to a third ILD level includes via level Vx+1 and metal level Mx+2,
  forming a first dielectric layer and forming a second upper dielectric layer over the first and second regions covering the first dielectric layer, wherein the first and second dielectric layers comprise low-k dielectric layers, and
  patterning the second dielectric layer to form a trench opening in the first region, wherein the trench opening extends from a top surface of the second dielectric layer to a top surface of the metal line in the metal level Mx in the first region which-accommodates the bottom electrode;

forming a two-terminal device element in between metal level Mx and via level Vx+1 in the first region, wherein the two-terminal device element is a storage element of the MRAM cell and comprises a device layer coupled in between first and second terminals, wherein the first terminal is a bottom electrode and is in direct contact with the metal line in metal level Mx of the first region, the second terminal is a top electrode and is formed on a top surface of the device layer, and the device layer is a MTJ stack of the MRAM cell;

forming a dual damascene interconnect over the second region in the second ILD level, wherein the dual damascene interconnect comprises a metal line in metal level Mx+1 and via contact in via level Vx in the second region; and forming dual damascene interconnects in the third ILD level over the first and second regions, wherein a dual damascene interconnect includes a metal line in metal level Mx+2 and a via contact in via level Vx+1, and wherein the dual damascene interconnect in the first region is coupled to the two-terminal device element and the dual damascene interconnect in the second region is formed over and is coupled to the dual damascene interconnect in the second ILD level.

5. The method of claim 4 comprising:
forming a bottom electrode layer over the second dielectric layer and fills the trench opening; and
performing a planarization process to remove excess bottom electrode layer to define the bottom electrode in the first region.

6. The method of claim 5 comprising:
forming various layers of the MTJ stack over the first and second regions;
forming a hard mask layer over the various layers of the MTJ stack; and
patterning the hard mask layer and various layers of the MTJ stack.

7. The method of claim 6 wherein patterning the hard mask layer and various layers of the MTJ stack comprises:
providing a mask over the hard mask layer; and
performing an etch process to remove exposed portions of the hard mask layer and layers of the MTJ stack not protected by the mask in the second region and completely removes the hard mask and layers of the MTJ stack from the second region, wherein the patterned hard mask includes side surfaces which are aligned with side surfaces of the patterned layers of the MTJ stack.

8. The method of claim 7 comprising:
forming a dielectric liner over the first and second regions, wherein the dielectric liner covers exposed surfaces of the patterned hard mask and layers of the MTJ stack in the first region; and
performing a blanket etch process to remove horizontal portions of the dielectric liner over the first region and to completely remove the dielectric liner in the second region, leaving vertical portions of the dielectric liner in the form of dielectric spacers lining sidewalls of the patterned layers of the MTJ stack in the first region.

9. The method of claim 8 comprising:
forming a third dielectric layer over the first and second regions; and
performing a planarization process to remove the third dielectric layer until a top surface of the MTJ stack is exposed.

10. The method of claim 9 comprising:
forming a fourth dielectric layer over the first and second regions;
patterning the fourth dielectric layer to form a trench opening in the first region;
forming a top electrode layer having the same material as the bottom electrode over the first and second regions and fills the trench opening in the first region; and
performing a planarization process to remove excess top electrode layer and define the top electrode.

11. The method of claim 10 wherein the dual damascene interconnect over the second region in the second ILD level is formed after forming the top electrode of the storage element.

12. The method of claim 4 wherein a total height of the MTJ stack with top and bottom electrodes are greater than a height of the via contact in via level Vx and is shallower or the same as a total height of the metal line in metal level Mx+1 and via contact in via level Vx.

13. The method of claim 9 comprising:
forming a dielectric liner which serves as an etch stop layer over the first and second regions;
patterning the dielectric liner to remove portions of the dielectric liner from the second region;
forming a fourth dielectric layer over the first and second regions and covers the patterned dielectric liner.

14. The method of claim 13 comprising:
patterning the fourth dielectric layer to simultaneously form trench openings in the first and second regions, wherein the trench opening in the first region extends from a top surface of the fourth dielectric layer which passes through the dielectric liner and to a top surface of the MTJ stack in the first region while the trench opening in the second region extends from a top surface of the fourth dielectric layer into a portion of the third dielectric layer.

15. The method of claim 14 comprising:
providing a conductive layer over the fourth dielectric layer and fills the trench opening;
planarizing the conductive layer to form the metal lines in metal level Mx +1, wherein the metal line in metal level Mx+1 in the first region serves as a top electrode and provides electrical connection to the storage element.

16. A device comprising:
a substrate defined with at least first and second regions;
a plurality of interlevel dielectric (ILD) levels having tight pitch disposed over the first and second regions of the substrate, wherein the plurality of ILD levels comprises a first dielectric liner,
a second upper dielectric liner over the first and second regions covering the first dielectric liner,
a trench opening in the second dielectric liner,
an ILD level of which a two-terminal element disposed thereon corresponds to a first ILD level and its metal level corresponds to Mx,
an immediate ILD level overlying the metal level Mx corresponds to a second ILD level includes a via level Vx and a metal level Mx+1, and
the next overlying ILD level corresponds to a third ILD level includes a via level Vx+1 and a metal level Mx+2;
a two-terminal device element disposed in between the metal level Mx and the via level Vx+1 in the first region, wherein the two-terminal device element comprises a device layer coupled in between the first and second terminals, wherein the first terminal is in direct contact with a metal line in the metal level Mx of the first region and the second terminal is formed on a top surface of the device layer, and wherein the device layer is a MTJ stack of a MRAM cell, and wherein a total height of the MTJ stack with top and bottom electrodes is greater than a height of a via contact in the via level Vx and is shallower or same as a total height of a metal line in the metal level Mx+1 and the via contact in the via level Vx;
a dual damascene interconnect disposed over the second region in the second ILD level, wherein the dual damascene interconnect comprises a metal line in the metal level Mx+1 and the via contact in the via level Vx in the second region; and
dual damascene interconnects disposed in the third ILD level over the first and second regions, wherein a dual damascene interconnect includes a metal line in the metal level Mx+2 and a via contact in the via level Vx+1, and wherein the dual damascene interconnect in the first region is coupled to the two-terminal device element and the dual damascene interconnect in the second region is disposed over and is coupled to the dual damascene interconnect in the second ILD level.

17. The device of claim 16 wherein at least the first and second ILD levels are defined at 1× design rule.

18. The device of claim 17 wherein the first region is a memory region for accommodating at least one memory cell, the second region is a logic region for accommodating at least one logic component, and wherein the two-terminal device element is a storage element of the MRAM cell, the first terminal is the bottom electrode, the second terminal is the top electrode.

19. The device of claim 18 wherein the second dielectric liner is disposed in the second ILD level adjacent to the top electrode and the MTJ stack in the first region, wherein the top electrode of the storage element comprises the same material as the metal line in the metal level Mx+1 in the second region.

* * * * *